United States Patent
Gupta et al.

(10) Patent No.: US 9,331,671 B2
(45) Date of Patent: May 3, 2016

(54) AUTOMATIC POWER SWITCHING AND POWER HARVESTING IN THIN OXIDE OPEN DRAIN TRANSMITTER CIRCUITS, SYSTEMS, AND METHODS

(71) Applicant: STMICROELECTRONICS INTERNATIONAL N.V., Schiphol (NL)

(72) Inventors: Nitin Gupta, Noida (IN); Paramjeet Singh Sahni, New Delhi (IN); Tapas Nandy, Delhi (IN); Manish Garg, Uttar Pradesh (IN)

(73) Assignee: STMicroelectronics International N.V., Amsterdam (NL)

( * ) Notice: Subject to any disclaimer, the term of this patent is extended or adjusted under 35 U.S.C. 154(b) by 24 days.

(21) Appl. No.: 14/283,043

(22) Filed: May 20, 2014

(65) Prior Publication Data

US 2015/0341017 A1    Nov. 26, 2015

(51) Int. Cl.
| | |
|---|---|
| *H04B 3/00* | (2006.01) |
| *H04L 25/00* | (2006.01) |
| *H03K 3/01* | (2006.01) |
| *H04N 5/44* | (2011.01) |
| *H04N 5/63* | (2006.01) |
| *H03K 19/0185* | (2006.01) |

(52) U.S. Cl.
CPC .......... *H03K 3/01* (2013.01); *H03K 19/018528* (2013.01); *H04N 5/44* (2013.01); *H04N 5/63* (2013.01)

(58) Field of Classification Search
None
See application file for complete search history.

(56) References Cited

U.S. PATENT DOCUMENTS

| | | | | |
|---|---|---|---|---|
| 5,883,529 A | * | 3/1999 | Kumata | G06F 1/06 326/83 |
| 2012/0169403 A1 | * | 7/2012 | Gupta | H04L 25/0272 327/530 |

* cited by examiner

*Primary Examiner* — Chieh M Fan
*Assistant Examiner* — Wednel Cadeau
(74) *Attorney, Agent, or Firm* — Seed IP Law Group PLLC

(57) ABSTRACT

A power harvesting circuit includes a new transmitter topology that ensures that no junction of thin oxide transistors forming the power harvesting circuit will experience a voltage across junctions of the transistors that is more than a maximum tolerable junction voltage. A supplemental power feed circuit operates to provide a supplemental feed current to components in a transmitter circuit when power harvested from a receiver circuit is insufficient to adequately power these components of the transmitter circuit, which may occur during high frequency operation of communications channels coupling the transmitter and receiver circuits. The supplemental power feed circuit also operates to sink a shunt current when power harvested from the receiver circuit is more than is needed to power the components in the transmitter circuit.

19 Claims, 9 Drawing Sheets

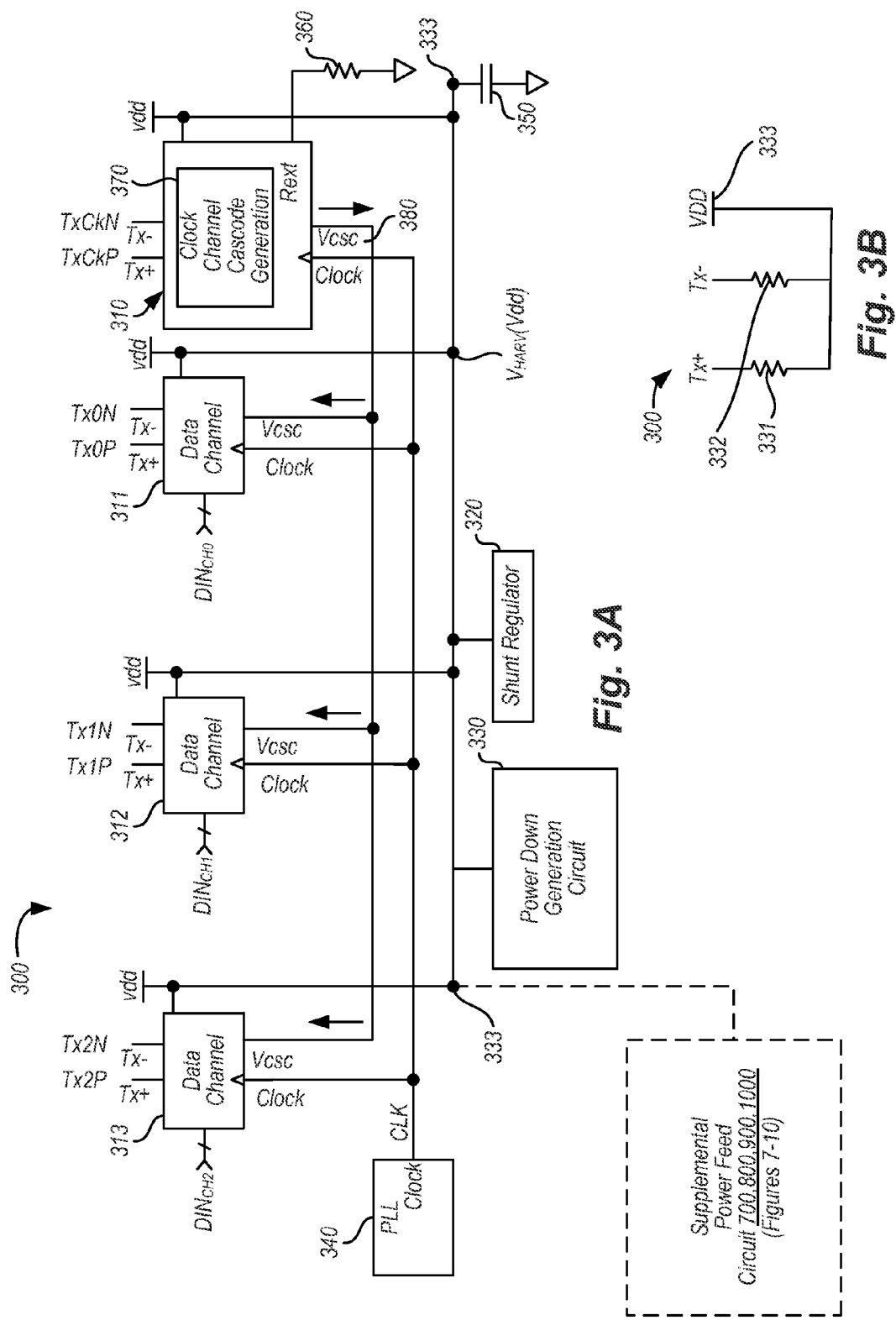

AUTOMATIC POWER SWITCHING AND POWER HARVESTING IN THIN OXIDE OPEN DRAIN TRANSMITTER CIRCUITS, SYSTEMS, AND METHODS

TECHNICAL FIELD

The present disclosure relates generally to power harvesting in open drain transmitter circuits and more specifically to improved high frequency operation and the protection of thin oxide devices in open drain transmitter circuits.

BACKGROUND

Some communications channels or interfaces utilize what is termed "open drain" transmitter circuits, such as those utilized in the interface standard know as a high-definition multimedia interface (HDMI). In the HDMI standard, a receiver circuit provides a current through termination resistors contained in the receiver circuit, and this current then flows through data lines of a communications channel to the open drains of metal oxide semiconductor (MOS) transistors contained in the transmitter circuit. The open drain transistors are turned ON and OFF to thereby communicate data from the transmitter over the data lines to the receiver, with the receiver supplying the power for this communication. The communications channel typically includes a return ground path line through which the current from the receiver is fed back from the transmitter to the receiver.

This conventional approach results in the current that is supplied by the receiver being "sunk" to ground via the ground path line and thus results in this current being used for communicating data over the communications channel but not being otherwise utilized and wasted through sinking the current to ground. Recent approaches have attempted to utilize or "harvest" this current supplied by the receiver to power components contained in the transmitter. Using power harvested from the current provided by the receiver eliminates the need for having an additional power source in the transmitter, assuming this current can supply sufficient power for all components in the transmitter. There are issues, however, in attempting to harvest the current provided by the receiver. In some instances, the resulting voltage that can be generated using the harvested current is insufficient to power all the components in the transmitter (e.g., some transmitter components require a higher voltage than can be generated simply using the harvested current). In other situations, the receiver may be powered by a supply voltage having a sufficiently large value that this receiver supply voltage can damage low voltage components in the transmitter. This is particularly true where the transmitter includes low voltage thin oxide MOS devices, for example.

There is a need for improved circuits, systems, and methods of harvesting power in communications channels utilizing open drain, or open collector, topologies.

SUMMARY

According to one embodiment of the present disclosure, a power harvesting circuit includes a new transmitter topology that ensures that no junction of thin oxide transistors forming the power harvesting circuit will experience a voltage across junctions of the transistors that is more than a maximum tolerable junction voltage.

According to another embodiment of the present disclosure, a supplemental power feed circuit operates to provide a supplemental feed current to components in a transmitter circuit when power harvested from a receiver circuit is insufficient to adequately power these components of the transmitter circuit, which may occur during high frequency operation of communications channels coupling the transmitter and receiver circuits. The supplemental power feed circuit also operates to sink a shunt current when power harvested from the receiver circuit is more than is needed to power the components in the transmitter circuit.

BRIEF DESCRIPTION OF THE DRAWINGS

FIG. 3A is a functional block diagram of an open drain transmitter including four communications channels according to one embodiment of the present disclosure.

FIG. 3B is a simplified schematic of the start-up circuit in the open drain transmitter of FIG. 3A.

DETAILED DESCRIPTION

In the following description, certain details are set forth in conjunction with the described embodiments of the present disclosure to provide a sufficient understanding of these embodiments. One skilled in the art will appreciate, however, that embodiments of the disclosure may be practiced without these particular details. Furthermore, one skilled in the art will appreciate that the example embodiments described below do not limit the scope of the present disclosure, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. Finally, the operation of well-known components and/or processes has not been shown or described in detail below to avoid unnecessarily obscuring the present disclosure.

Figure 1:
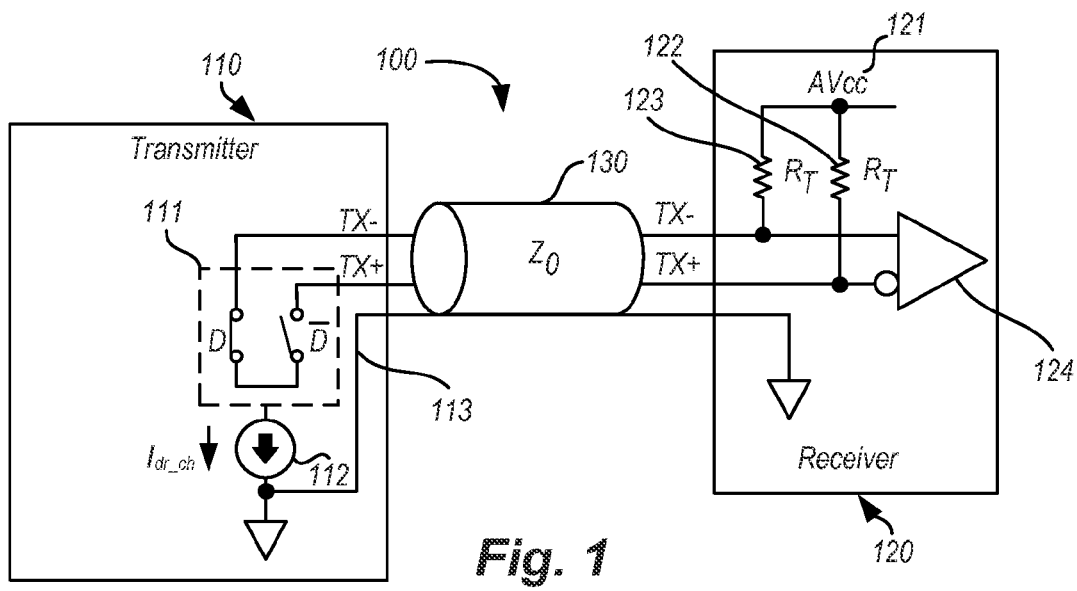
FIG. 1 is a simplified schematic showing a conventional communications channel interconnecting a receiver circuit and an open drain transmitter circuit.

In open drain transmitter circuits, such as those utilized in the interface standard know as a high-definition multimedia interface (HDMI), a receiver circuit provides a voltage through termination resistors and over communication or data lines to the open drains of metal oxide semiconductor (MOS) transistors in the transmitter circuit. FIG. 1 illustrates a typical interconnection between open drain transmitter and receiver circuits. A transmitter circuit or transmitter 110 includes a differential pair of open drain MOS transistors 111, which are represented as switches in the figure, and which function to transmit differential data over complementary communication or data lines TX− and TX+ to a receiver 120. The drains of the transistors 111 are connected to the first and second complementary data lines TX− and TX+, which form part of a communications channel 130 between the transmitter 110 and receiver 120. The transistors 111 in the transmitter 110 draw current from a voltage source AVcc, also designated with reference number 121, in the receiver 120.

During operation of the communications channel 130 current flows from the voltage source AVcc and through the terminating resistors 122, 123 in the receiver 120, then through the data lines TX− and TX+ in the communications channel 130, and finally through the open drain transistors 111 in the transmitter 110 to thereby communicate data over the channel. A current source 112 in the transmitter 110 is coupled in series with the open drain transistors 111 to determine the current drawn from the receiver 120 by these transistors. The value of a drive current $I_{dr\_ch}$ drawn by the current source 112 is typically defined by the particular protocol being used to communicate data over the channel 130. Where the channel 130 is implementing the HDMI standard, for example, the current source 112 may draw the current $I_{dr\_ch}$=10 mA per communications channel at a given frequency or frequency range of operation, and this current will typically vary as a function of the frequency of operation. As shown in FIG. 1, the communications channel 130 typically also includes a return ground path line 113 through which the current from the receiver 120 is fed back from the transmitter 110 to the receiver. In the present description the communications channels and communications interface formed collectively by these channels is assumed to be the HDMI standard by way of example, but the concepts and principles described herein may be applied to communications channels utilizing other interfaces or protocols, as will be appreciated by those skilled in the art.

The conventional approach of FIG. 1 results in the drive current $I_{dr\_ch}$ supplied by the receiver 120 being "sunk" to ground via the ground path line 113 and thus results in this current being used for communicating data over the channel 130 but not otherwise being utilized. The HDMI standard includes three data channels and one clock channel corresponding to the channel 130 of FIG. 1, each channel utilizing the drive current $I_{dr\_ch}$ for a total current of ($4 \times I_{dr\_ch}$). This total current may be a relatively large current (e.g., 40 mA where $I_{dr\_ch}$=10 mA) relative to the currents consumed in modern electronic circuits, and thus attempts have been made to utilize or "harvest" these drive currents $I_{dr\_ch}$ supplied by the receiver 120 to power components in the transmitter 110. Using power harvested from the drive currents $I_{dr\_ch}$ from the receiver 120 eliminates the need of having an additional power source in the transmitter 110, assuming this current can supply sufficient power for all components in the transmitter.

Figure 2:
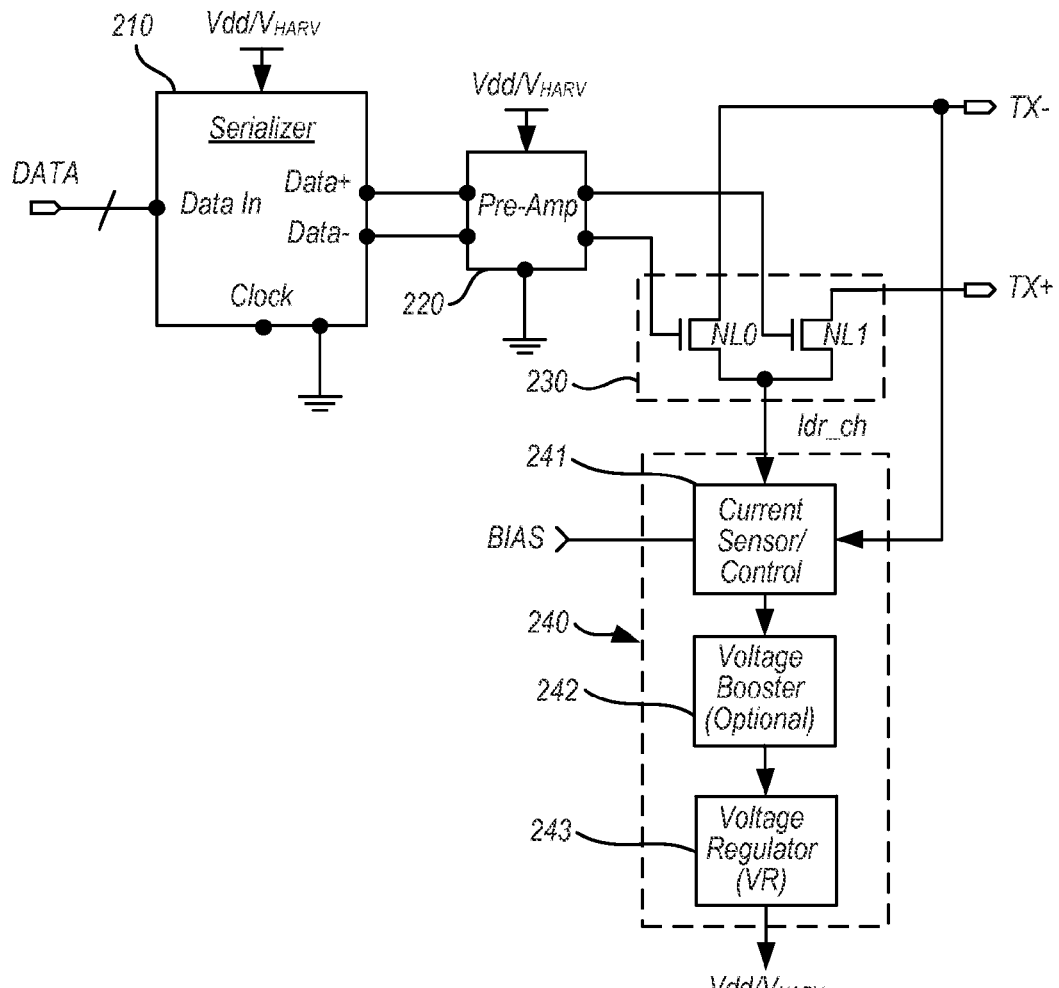
FIG. 2 is a schematic of an open drain transmitter utilizing conventional power harvesting techniques.

An example of a known HDMI current harvesting approach is shown for an HDMI channel in FIG. 2. FIG. 2 shows an open drain differential pair of transistors NL0 and NL1. The transistors NL0, NL1 are MOS transistors and thus include a drain node, source node, and a gate node, as will be appreciated by those skilled in the art. The drain and source nodes may be generically referred to as signal nodes and the gate node as a control node herein. This is done to make it clear that embodiments of the present disclosure may be applied to different transistor technologies, such as bipolar transistors, and thus these nodes of a transistor may be referred to generically as signal nodes and a control node. For example, aspects of the embodiments described herein may be applied to open collector communications channels in transmitters utilizing bipolar transistors.

The gates of NL0 and NL1 receive differential data from a pre-amplifier 220 and the drains of the transistors NL0 and NL1 are coupled to data lines or pads TX− and TX+. Data is input to the pre-amplifier 220 from a serializer circuit 210 that receives parallel input data DATA and converts this input data into serial data that is to be communicated over the data lines TX− and TX+. A drive current $I_{dr\_ch}$ through the differential transistors NL0 and NL1 is determined by a current sensor/control block 241 that receives a bias signal BIAS having a value that sets the drive current $I_{dr\_ch}$. The current sensor/control block 241 forms part of a voltage recovery circuit 240 which generates or "recovers" power utilizing the drive current $I_{dr\_ch}$ through the use of a voltage regulator 243. This harvested or recovered power in the transmitter 110 is then utilized to provide a supply voltage Vdd to power the serializer 210, preamplifier 220 and other circuitry in the transmitter. The voltage Vdd generated by the voltage recovery circuit 240 is also referred to as the harvested voltage $V_{HARV}$ in the following description.

In order properly control the transistors NL0 and NL1, the pre-amplifier 220 requires that the voltage Vdd/$V_{HARV}$ have a value that is greater than the voltage on the data line TX−, TX+ being driven high and therefore a voltage booster 242 is required to provide the pre-amplifier 220 with the voltage Vdd/$V_{HARV}$ having a sufficient magnitude. As a result of the need to "boost" the harvested voltage Vdd/$V_{HARV}$ the approach of FIG. 2 is not very efficient due to the additional power consumed by the voltage booster 242. The voltage booster 242 also results in limits on the speed or data rate at which data can be communicated over the data lines TX−, TX+, as will be appreciated by those skilled in the art. More specifically, as the speed or data rate of data being communicated over the data lines TX−, TX+ increases, the harvested current $I_{dr\_ch}$ in FIG. 2 may be insufficient to generate the power required for all components in the transmitter 110. This is because at higher data rates and thus higher frequencies for the data being communicated, the harvested current $I_{dr\_ch}$ from the receiver 120 must charge and discharge parasitic capacitors of components in the transmitter 110, meaning less of the harvested current is available to power the components in the transmitter. Also, as mentioned above, the voltage on the data lines TX−, TX+ may in some instances have a sufficiently large value that this voltage can damage thin oxide MOS transistors in the transmitter 110, as will be discussed in more detail below.

FIG. 3A is a functional block diagram of an open drain transmitter circuit 300 including four communications channels 310, 311, 312, and 313 according to one embodiment of the present disclosure. This embodiment may correspond to implementation of the HDMI standard, which requires four communications channels, namely three data channels and one clock channel. Embodiments of the present disclosure are, however, not limited to this number of communications channels and other embodiments of the disclosure may contain more or fewer channels. The open drain transmitter circuit or transmitter 300 of FIG. 3A includes a clock channel 310, a first data channel 311, a second data channel 312 and a third data channel 313. Each data channel 311, 312, 313 receives corresponding input data $DIN_{CH0}$, $DIN_{CH1}$, and $DIN_{CH2}$ and in response to the input data provides to the receiver 120 (FIG. 1) two differential transmission output signals Tx0P and Tx0N, Tx1P and Tx1N, and Tx2P and Tx2N.

Each of the four channels 310, 311, 312 and 313 is connected to receive a clock signal CLK generated by a phase-locked loop (PLL) 340 and is also connected to receive the harvested voltage Vdd ($V_{HARV}$). The harvested voltage $V_{HARV}$ in this way provides the power to operate the channels 310-313 in the open drain transmitter circuit 300, as will be described in more detail below. The harvested voltage $V_{HARV}$ is supplied on a harvested node 333 that is coupled to a shunt regulator 320, a power down generation circuit 330 and an external capacitor 350. The clock channel 310 receives the clock signal CLK from the PLL 340 and in response to the clock signal generates differential clock signals TxCKP and TxCKN that are supplied over corresponding data lines TX+, TX− to the receiver 120 (FIG. 1). The clock channel 310 is also connected to an external resistor 360 that is utilized in generating a control voltage that is termed a "cascode drive voltage" $V_{CSC}$ herein. The clock channel 310 includes a clock channel cascode generation circuit 370 which generates the cascode drive voltage $V_{CSC}$ that functions as a control or biasing signal for the channels 310, 311, 312 and 313 to thereby control the value of a drive current $I_{TX}$ from the receiver 120 (FIG. 1) that is used in communicating signals over the channels and in generating the harvested voltage $V_{HARV}$. The shunt regulator 320 and external capacitor 350 form a voltage regulator that generates and regulates the harvested voltage $V_{HARV}$ from the drive currents $I_{TX}$ supplied by the receiver 120 through each of the channels 310-313. This voltage regulator 320, 350 only provides power when the transmitter 300 is turned ON and therefore the transmitter 300 includes the power down generation circuit 330 to supply the voltage Vdd/$V_{HARV}$ when the transmitter is operating in a powered-down mode of operation.

FIG. 3B is a simplified schematic illustrating one embodiment of the power down generation circuit 330 of FIG. 3A. In this embodiment, the power down generation circuit 330 includes two resistors connected between the data lines TX+ and TX− and the node 333 on which the harvested voltage $V_{HARV}$ is generated. The power down generation circuit 330 of FIG. 3B may be provided for each of the channels 310, 311, 312, 313 and may be selectively connected to the corresponding data lines TX+, TX− or may be continuously connected to these data lines. In the embodiment of FIG. 3B, the data lines Tx+ and Tx− are connected through respective resistors 331 and 332. In operation, during a power-down mode of operation of the transmitter 300 the supply voltage AVcc of the receiver 120 (FIG. 1) is supplied over the data lines TX+, TX− and through the resistors 331, 332 to generate the voltage $V_{HARV}$/Vdd on the node 333 and thereby supply power to the required components in the transmitter 300 even during the power-down mode. The power-down mode is a mode of operation of the transmitter 300 in which selected circuitry in the transmitter is placed in a state that minimizes or reduces the power consumption of this circuitry and thus the overall power consumption of the transmitter. Typically, the transmitter 300 would enter or be placed into the power-down mode when no data needs to be transmitted over the data channels 311, 312, 313.

Finally with regard to FIG. 3A, a supplemental power feed circuit, which is designated 700, 800, 900, or 1000, is also coupled to the node 333 on which the harvest voltage $V_{HARV}$ is generated. The supplemental power feed circuit operates to supply additional power to the node 333 when the drive currents $I_{dr\_ch}$ from the data channels 311, 312 and 313 and the clock channel 310 are insufficient to power the desired components in the transmitter 300 and to remove power from the node 333 when drive currents $I_{dr\_ch}$ from the data channels 311, 312 and 313 and the clock channel 310 are greater than is needed to power these components, as will be described in more detail below. Briefly, the supplemental power feed circuit supplies additional current to the node 333 when the drive currents $I_{dr\_ch}$ are less than the current needed to maintained the desired harvested voltage $V_{HARV}$ and power the desired components in the transmitter 300, and the supplemental power feed circuit removes current from the node 333 when the drive currents are greater than the current needed to maintain the harvested voltage and power the desired components in the transmitter, as will also be described in more detail below.

Figure 4A:
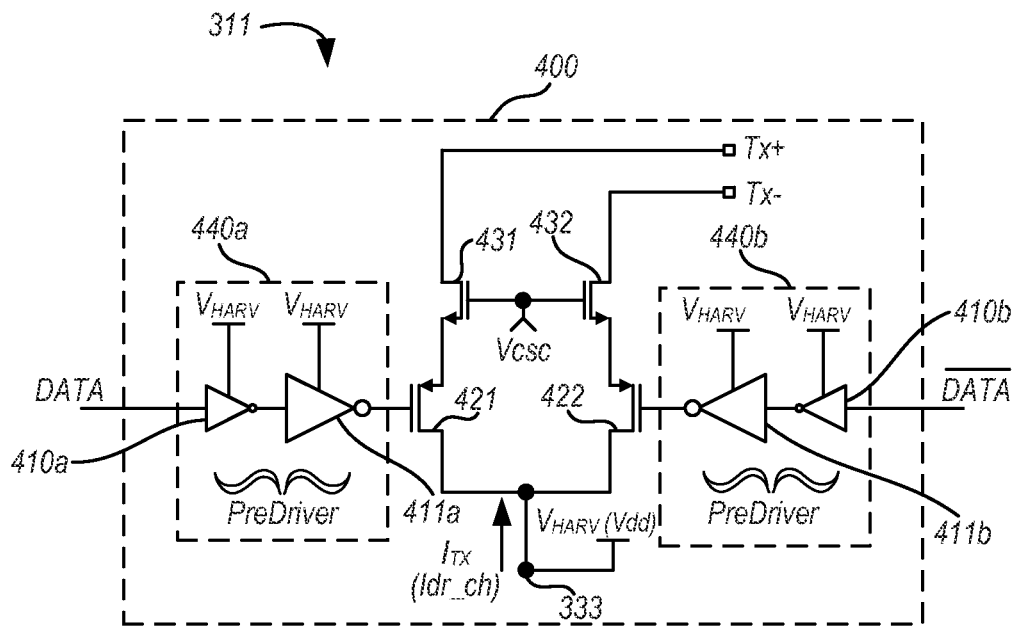
FIG. 4A is a schematic of an open drain differential pair of MOS transistors for one of the data channels in the transmitter of FIG. 3A.
Figure 4B:
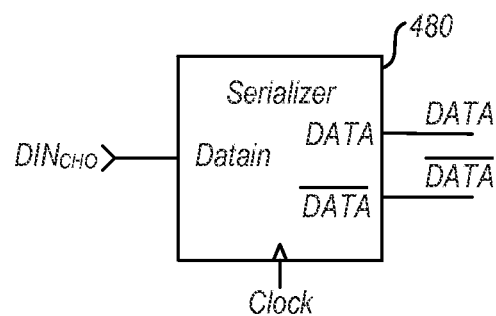
FIG. 4B is a functional block diagram of a serializer circuit for use in combination with the data channel of FIG. 4A.

FIG. 4A is a schematic of the first data channel 311 of FIG. 3A including a communications and power harvesting circuit 400 according to one embodiment of the present disclosure. The second and third data channels 312 and 313 are identical to the first data channel 311 in the embodiment of FIG. 3A and thus only the first data channel 311 is shown and will be described in more detail with reference to FIG. 4A. Referring to FIG. 4B and to FIG. 1, a data serializer 480 receives parallel input data $DIN_{CH0}$ to be communicated from the transmitter 300 to the receiver 120. The serializer 480 converts the received parallel input data $DIN_{CH0}$ into a corresponding serial data stream, with each bit in this serial data stream being represented through complementary data signals DATA, $\overline{DATA}$. These complementary data signals DATA, $\overline{DATA}$ are applied to the first data channel 311 as seen in FIG. 4A to thereby transmit the corresponding data bit over the data lines TX+, TX− to the receiver 120 (FIG. 1).

The complementary data signals DATA, $\overline{DATA}$ generated by the serializer 480 are applied to first and second predriver circuits 440a and 440b. The first and second predriver circuits 440a, 440b each include a first amplifier 410a, 410b in series with a second amplifier 411a, 411b as seen in FIG. 4A. The predriver circuits 440a, 440b are powered by the harvested voltage voltages $V_{HARV}$ or the supply voltage Vdd on the node 333 (FIG. 3A). The supply voltage Vdd is generated by the startup circuit 330 of FIGS. 3A and 3B during startup of the transmitter 300 as previously described. The predriver circuit 440a operates to provide any required level shifting of the received DATA signal and generate an output signal that is applied control a first P-channel MOS (PMOS) transistor 421. The predriver circuit 440b operates in the same way to provide any required level shifting of the received $\overline{DATA}$ signal and generate an output signal that is applied control a second P-channel MOS (PMOS) transistor 422.

The drains of the PMOS transistors 421 and 422 are connected to the node 333 on which the harvested voltage $V_{HARV}$ (Vdd) is generated. A source of the first PMOS transistor 421 and a source of the second PMOS transistor 422 are connected to sources of first and second N-channel MOS (NMOS) transistors 431 and 432, respectively. A drain of the first NMOS transistor 431 is connected to a corresponding data line TX+ and a drain of the second NMOS transistor 432 is connected to corresponding data line TX−. The data lines are coupled to a corresponding communications channel 311, 312, 313 as discussed above with reference to FIG. 3A. As seen referring back to FIG. 1, for each channel these data lines TX+, TX− of the corresponding channel are coupled to terminating resistors $R_T$ in the receiver 120. The gates of the first and second NMOS transistors 431, 432 receive the cascode drive voltage" $V_{CSC}$ generated by the clock channel cascode generation circuit 370 (FIG. 3A).

In operation, the serializer 480 receives the parallel input data $DIN_{CH0}$ and converts this data into a corresponding serial data in the form of the complementary data signals DATA, $\overline{DATA}$. For each bit of input data $DIN_{CH0}$ being serially communicated through the DATA, $\overline{DATA}$ signals the serializer 480 drives the signals to the appropriate voltage levels. For example, where a logic 1 is being communicated the serializer 480 may drive the DATA signal high and drive the $\overline{DATA}$ signal low. Conversely, when a logic 0 is being communicated the serializer 480 would then drive the DATA signal low and drive the $\overline{DATA}$ signal high. In response to the DATA, $\overline{DATA}$ signals, the predrivers 440a, 440b generate corresponding signals to activate or deactivate the PMOS transistors 421, 422. The high DATA signal, for example, would cause the amplifier 411a to drive its output high, turning OFF the PMOS transistor 421. Conversely, the low $\overline{DATA}$ signal would cause the amplifier 411b to drive its output low, turning ON the PMOS transistor 422.

The NMOS transistors 431 and 432 are biased by the cascode drive voltage Vcsc that has a value that determines the value of a drive current $I_{TX}$ through the data channel 311. This drive current $I_{TX}$ shown in FIG. 4A and subsequent figures, and used in the description below, corresponds to the drive current $I_{dr\_ch}$ illustrated and previously discussed with reference to FIGS. 1 and 2. The drive current $I_{TX}$ flows through one of the NMOS transistors 431, 432 and the turned ON one of the PMOS transistors 421, 422 to the node 333, as shown in FIG. 4A. For example, when a logic 1 is being communicated the PMOS transistor 421 is turned OFF so no current flows through this transistor. In this situation, the data signal on the data line TX+ is driven or pulled high through the pull-up or termination resistor $R_T$ in the receiver 120 (FIG. 1). At the same time, the when a logic 1 is being communicated the PMOS transistor 422 is turned ON, meaning that the drive current $I_{TX}$ flows through the termination resistor $R_T$ in the receiver 120 and through the NMOS transistor 432 and turned ON PMOS transistor 422 to the node 333. This drive current $I_{TX}$ is used to charge the capacitor 350 (FIG. 3A) and thereby generate the harvested voltage $V_{HARV}$, as will be described in more detail below. The data signal on the data line TX− is driven low through the NMOS transistor 432 and turned ON PMOS transistor 422. The data channel 311 works in a complementary way when a logic 0 is being communicated, with the PMOS transistor 422 being turned OFF and the drive current $I_{TX}$ flowing through the PMOS transistor 421 to the node 333.

Figure 5A:
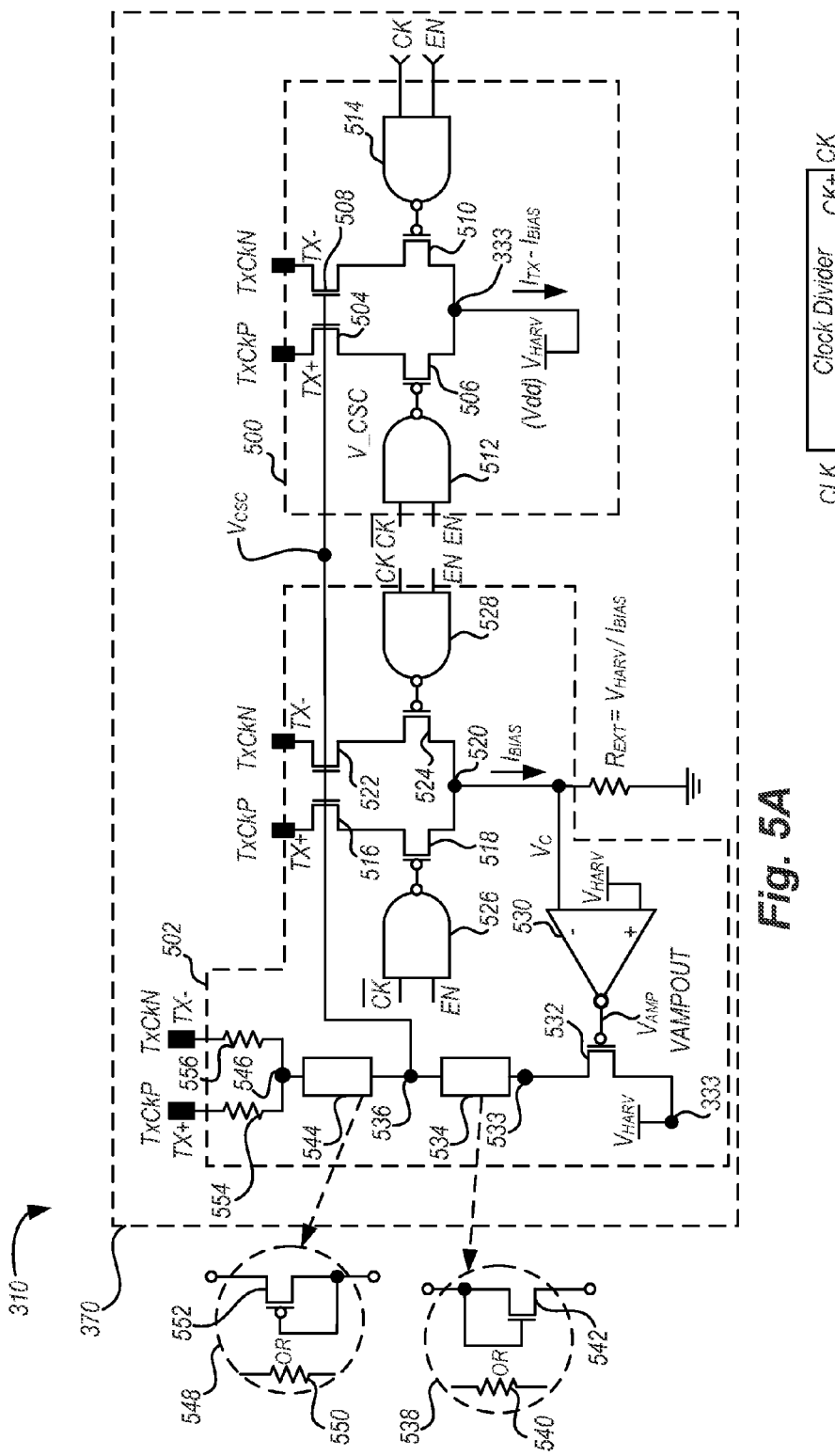
FIG. 5A is a schematic of the clock channel circuitry of FIG. 3A including a communications and power harvesting circuit and a power harvesting control circuit according to one embodiment of the present disclosure.

FIG. 5A is a schematic of the clock channel 310 of FIG. 3A including the clock channel cascode generation circuit 370 (FIG. 3A), which itself includes a communications and power harvesting circuit 500 and a power harvesting control circuit 502 according to one embodiment of the present disclosure. The structure and operation of the circuits 500 and 502 in the embodiment of the clock channel 310 of FIG. 5A ensures that thin oxide devices contained in the open drain transmitter circuit 300 (FIG. 3A) are not damaged by the supply voltage AVcc in the receiver 120 (FIG. 1) coupled to the open drain transmitter circuit, as will now be described in more detail. The supply voltage AVcc of the receiver 120 may, for example, be 3.3V while thin oxide MOS transistors in the transmitter circuit 300 may have a maximum tolerable junction voltage Vmax. The maximum tolerable junction voltage Vmax is the maximum voltage that can be placed across any junction of the thin oxide MOS transistors in the transmission circuit 300 without potentially damaging and thereby impairing the operation of the MOS transistors and the transmission circuit. Thus, if the voltage across any junction (e.g., drain-to-source junction, drain-to-gate junction, gate-to-source junction, gate oxide) of a MOS transistor in the transmitter circuit 300 exceeds the maximum tolerable junction voltage Vmax, the MOS transistor can be damaged. The voltage Vmax is a function of the size of the MOS transistors and the process parameters utilized in forming the transistors, as will be appreciated by those skilled in the art. The structure and operation of the power harvesting control circuit 502 ensures that the junction voltages of the MOS transistors in the transmitter circuit 300 do not exceed the maximum tolerable junction voltage, as will be explained in more detail below. As will be appreciated by those skilled in the art, thin oxide transistors are transistors having deep submicron dimensions, meaning the dimensions of the transistors are so small that the oxide layers, such as the gate oxide, are likewise so thin that the maximum tolerable voltage junction voltages across this oxide and other junctions in the transistor are greatly reduced.

In the embodiment of FIG. 5A, the communications and power harvesting circuit 500 of the clock channel 310 is substantially the same as the data channel 311 previously described with reference to FIG. 4A. The communications and power harvesting circuit 500 includes an NMOS transistor 504 and PMOS transistor 506 coupled in series between the data line TX+ and the node 333 on which the harvested voltage $V_{HARV}$ is generated. Similarly, an NMOS transistor 508 and PMOS transistor 510 are coupled in series between the data line TX− and the node 333. The data lines TX+, TX−correspond to the data lines over which the differential clock signals T×CKP and T×CKN are supplied, as previously discussed with reference to FIG. 3A. A NAND gate 512 receives the $\overline{CK}$ signal and an enable signal EN and has an output that is applied to activate or deactivate the PMOS transistor 506 responsive to the $\overline{CK}$ signal when the EN signal is active high. A NAND gate 514 receives the CK signal and the EN signal and has an output that is applied to activate or deactivate the PMOS transistor 510 responsive to the CK signal when the EN signal is active high. Other circuitry (not shown) in the open drain transmitter circuit 300 containing the clock channel 310 generates the EN signal. The EN signal accordingly gates the CK and $\overline{CK}$ clock signals, passing the clock signal when the EN signal is active and blocking the clock signal when the EN signal is inactive.

Figure 5B:
FIG. 5B is a functional block diagram of a clock divider circuit for generating the complementary clock signals applied to the clock channel of FIG. 5A.

FIG. 5B is a functional block diagram of a clock divider circuit 580 for generating the complementary clock signals CK, $\overline{CK}$ applied to the clock channel of FIG. 5A. The clock divider circuit 580 is part of the clock channel cascode generation circuit 370 and receives the clock signal CLK from the PLL 340 in FIG. 3A. In response to the clock signal CLK the clock divider circuit 580 generates the complementary clock signals CK, $\overline{CK}$. The clock divider circuit 580 may divide the frequency of the CLK signal such that the frequency of the signals CK, $\overline{CK}$ is less than the frequency of the CLK signal. For example, if the frequency of the CLK signal is f then the frequency of the CK, $\overline{CK}$ signals is (f/N) where N is some value, typically an integer value, such that the frequency of the CK, $\overline{CK}$ signals is lower than the frequency f of the CLK signal.

In operation of the communications and power harvesting circuit 500, the clock divider circuit 580 generates the CK, $\overline{CK}$ signals responsive to the CLK signal. When the enable signal EN is inactive low, the NAND gates 512, 514 are disabled, meaning each NAND gate drives its output high to thereby turn OFF the corresponding PMOS transistor 506, 510. In this case the circuit 500 is disabled, and does not affect the voltage on the node 333. The communications and power harvesting circuit 500 is enabled when the EN signal is active high thereby enabling each of the NAND gates 512 and 514. When enabled, each NAND gate 512, 514 activates and deactivates the corresponding PMOS transistor 506, 510 responsive to the corresponding complementary clock signal CK, $\overline{CK}$. More specifically, when the $\overline{CK}$ signal is low the NAND gate 512 and drives its output high turning OFF the PMOS transistor 506 and when the CK signal is high the NAND gate 514 drives its output low turning ON the PMOS transistor 510.

The NMOS transistors 504 and 508 are biased by the cascode drive voltage Vcsc having a value that determines the value of a current through the communications and power harvesting circuit 500 of the clock channel 310. The clock channel 310 must only draw the same drive current $I_{TX}$ from the receiver 120 (FIG. 1) as each of the data channels 311-313 according to the HDMI specification. This need not be the case for all embodiments of the present disclosure, but in HDMI embodiments the communication and power harvesting circuit 500 and power harvesting control circuit 502 in the clock channel 310 must collectively draw the drive current $I_{TX}$. As a result, if the power harvesting control circuit 502 draws a bias current $I_{BIAS}$, as will be explained in more detail below, then the communications and power harvesting circuit 500 will draw the drive current $I_{TX}$ minus the bias current $I_{BIAS}$, namely ($I_{TX}-I_{BIAS}$). This means that when the $\overline{CK}$ signal is low and the CK signal is high causing the PMOS transistors 506 and 510 to turn OFF and ON, respectively, the current ($I_{TX}-I_{BIAS}$) flows from the receiver 120 (FIG. 1) over the data line TX– and through the turned ON PMOS transistor 510 to the node 333 to supply this current ($I_{TX}-I_{BIAS}$) for generation of the harvested voltage $V_{HARV}$. The data line TX+ is in this situation driven high through the termination resistor $R_T$ as previously described for the data channel 311 with reference to FIG. 4A. The communications and power harvesting circuit 500 operates in a complementary way when the $\overline{CK}$ signal is high and the CK signal is low causing the PMOS transistors 506 and 510 to turn ON and OFF, respectively, resulting in the current ($I_{TX}-I_{BIAS}$) flowing through the turned ON PMOS transistor 506 to charge the node 333 for generating the harvested voltage $V_{HARV}$.

Turning now to the power harvesting control circuit 502, this circuit functions to generate the cascode drive voltage Vcsc responsive to the CK, $\overline{CK}$ signals, as will now be described in more detail. The power harvesting control circuit 502 includes an NMOS transistor 516 and PMOS transistor 518 coupled in series between the data line TX+ and a node 520 along with an NMOS transistor 522 and PMOS transistor 524 coupled in series between the data line TX– and the node 520. A NAND gate 526 activates and deactivates the PMOS transistor 518 responsive to the $\overline{CK}$ and EN signals while a NAND gate 528 activates and deactivates the PMOS transistor 524 responsive to the CK and EN signals. The operation of the components 516-528 responsive to the EN and the CK, $\overline{CK}$ signals is the same as previously described for the components 504-514 in the communications and power harvesting circuit 500, and thus, for the sake of brevity, will not again be described in detail. Once again, the NMOS transistors 516 and 522 are biased by the cascode drive voltage Vcsc such that the value of the cascade drive voltage sets the value of the bias current $I_{BIAS}$ that flows through the activated one of the PMOS transistors 518 and 524 to the node 520. A resistor $R_{EXT}$ is also coupled between the node 520 and ground and has a value selected such that when the bias current $I_{BIAS}$ flows through this resistor a control voltage VC is developed across the resistor to control the value of the generated cascode drive voltage Vcsc, as will be described in more detail below.

The power harvesting control circuit 502 further includes an operational amplifier 530 having a non-inverting input coupled to the node 522 to receive the control voltage VC and inverting input coupled to the node 333 to receive the harvested voltage $V_{HARV}$. The operational amplifier 530 operates, in combination with several other components to be described next, to adjust the value of the cascode drive voltage Vcsc. The operational amplifier 530 varies the voltage Vcsc to adjust the biasing of the NMOS transistors 516 and 522 to thereby adjust the value of the bias current $I_{BIAS}$ such that the control voltage VC equals the harvested voltage $V_{HARV}$ (VC=$I_{BIAS} \times R_{EXT}$). In performing this control, the output of the operational amplifier 530 is applied to control a PMOS transistor 532 coupled in series with a first electronic device 534 between the node 333 on which the harvested voltage $V_{HARV}$ is generated and a bias node 536 on which the cascode drive voltage Vcsc is generated. A node 533 is defined at the interconnection of the source of the PMOS transistor 532 and the first electronic device 534. As indicated in a cutaway view 538 of the device 534, the device may be a resistor 540 or a diode-coupled NMOS transistor 542. A second electronic device 544 is coupled between the node 536 and a node 546 as illustrated. A cutaway view 548 illustrates that the second electronic device 544 may be a resistor 550 or a diode-coupled PMOS transistor 552. Other suitable components for the first and second electronic devices 534 and 544 will be appreciated by those skilled in the art. Finally, the data line TX+ is coupled through a resistor 554 to the node 546 and the data line TX– is coupled through a resistor 556 to the node 546 to provide power from the receiver 120 (FIG. 1) over the data lines to this portion of the power harvesting control circuit 502.

In operation of the power harvesting control circuit 502, when the enable signal EN is active high the clock channel 310 and transmitter 300 are operating in an active mode of operation in which data is communicated over the data channels 311-313 (FIG. 3A) and the differential clock signals are communicated over the clock channel 310 (FIG. 3A). In response to the active EN signal the power harvesting control circuit 502 is activated and generates the Vcsc voltage responsive to CK, $\overline{CK}$ signals. More specifically, the PMOS transistors 518 and 524 are alternately activated responsive to the CK, $\overline{CK}$ signals applied to these transistors via the NAND gates 526 and 528. The bias current $I_{BIAS}$ flows through the activated PMOS transistor 518, 524 and through the resistor $R_{EXT}$ to generate the control voltage VC. In response to the control voltage VC, the operational amplifier 530 adjusts its output to thereby control the PMOS transistor 532 to vary the current flowing through this PMOS transistor and the series connected electronic devices 534 and 544. This current is supplied by the receiver 120 (FIG. 1) as previously mentioned and thus the operational amplifier 530 controls the PMOS transistor 532 to thereby control the value of the current flowing through the resistors 554 and 556 to the node 546 and then through the electronic devices 544 and 534 and through the PMOS transistor 532 to the node 333. The value of the current flowing through these components determines the value of the voltage at the node 536, which is the cascode drive voltage Vcsc that controls the biasing of the NMOS transistors 516 and 522 in the power harvesting control circuit 502. In this way, the operational amplifier 530 controls the PMOS transistor 532 to thereby adjust the value of the cascode drive voltage Vcsc. The operational amplifier 530 adjusts the voltage Vcsc to control the biasing of the NMOS transistors 516, 522 until the bias current $I_{BIAS}$ has a value such that $(I_{BIAS} \times R_{EXT})=VC=V_{HARV}$.

The power harvesting control circuit 502 generates the cascode drive voltage Vcsc having a value relative to the harvested voltage $V_{HARV}$ which ensures that no transistor junction in the open drain transmitter circuit 300 (FIG. 3A) will experience a voltage across that junction of more than the tolerable voltage limit. Thus, not only does the power harvesting control circuit 502 protect the transistors of the clock channel 310 of FIG. 5A, but it also protects the transistors of the data channels 311-313 as well. Referring back to FIG. 4A, the data channel 311 receives the cascode drive voltage Vcsc to control the biasing of the NMOS transistors 431, 432, and the same is true for data channels 312 and 313. In this way, the power harvesting control circuit 502 generates the voltage Vcsc having a value relative to the generated harvested voltage $V_{HARV}$ to prevent any of the MOS transistors in the transmitter circuit 300, which may be low voltage thin oxide transistors, from being damaged by the higher supply voltage AVcc utilized in the receiver 120 (FIG. 1).

Also note that the power harvesting control circuit 502 does not waste power or current from the receiver 120 because as seen in FIG. 5A the current drawn from the receiver via the data lines TX+, TX− flows through the resistors 554, 556, electronic devices 544, 534, and through the PMOS transistor 532 to the node 333 and is thus utilized in generating the harvested voltage $V_{HARV}$. In the power harvesting control circuit 502 only the bias current $I_{BIAS}$ through the resistor $R_{EXT}$ is wasted (i.e., not utilized in powering the transmitter 300). The bias current $I_{BIAS}$ is needed to control the value of the cascode drive voltage Vcsc, but the magnitude of this bias current can be made relatively small so that this wasted current and power from the receiver is insignificant. For example, in the HDMI embodiment of FIG. 3A, the value of the resistor $R_{EXT}$ can be selected such that the bias current $I_{BIAS}$ is much less than 1 mA and is thus much less than the overall 40 mA consumed by the transmitter 300 from all four channels 310-313. Also note that the current flowing from the data lines TX+, TX− through the resistors 554, 556, electronic devices 544, 534, and the PMOS transistor 532 is assumed to be negligible since this current too is much less than the drive current $I_{TX}$.

Finally, the operation of the power harvesting control circuit 502 when the enable signal EN is inactive low will now be described. When the EN signal is inactive low the transmitter 300 is operating the power down mode of operation and no data or clock signals are being communicated over the channels 310-313. Even during the power down mode the power harvesting control circuit 502 continues generating the cascode drive voltage Vcsc to ensure protection of the MOS transistors in the transmitter circuit 300. When the EN signal is inactive low, the NAND gates 526 and 528 turn OFF PMOS transistors 518, 524 so that $I_{BIAS}$ is approximately zero. When $I_{BIAS}$ is approximately zero, the operational amplifier 530 will drive its output to a high voltage level in an attempt to turn OFF the PMOS transistor 532 to thereby increase the cascode drive voltage Vcsc. The operation of the power harvesting control circuit 502 in generating the cascode drive voltage Vcsc during the power down mode will now be described in more detail. Assume the first electronic device 534 is the resistor 540 and the second electronic device 544 is the resistor 550. During the power down mode (i.e., the EN signal is inactive low) the resistor network or resistor ladder formed by resistors 554, 556, 550 and 540 along with the PMOS transistor 532 generate the cascode drive voltage Vcsc. More specifically, as mentioned above the amplifier 530 drives its output, designated $V_{AMP}$ in FIG. 5A, to a high voltage level when the EN signal is inactive low. The voltage level of the $V_{AMP}$ signal that is applied to the gate of the PMOS transistor 532 is such that the gate-to-source voltage of this transistor $(V_{AMP}-V_{HARV})$ results in a current through the transistor and thus through the resistors 554, 5avcc56, 550, 540 to thereby generate the desired cascode drive voltage Vcsc on the node 536. The cascode drive voltage Vcsc has a value or level relative to a pull-up voltage on clock lines TX+, TX−, which is function of the value of the voltage source AVcc of the receiver 120 (FIG. 1), and relative to the harvested voltage $V_{HARV}$ so that the maximum tolerable junction voltage Vmax of the transistors in the transmitter 300 containing the channels 310-313 is not exceeded.

Referring to FIG. 5A, the amplifier 530, PMOS transistor 532, first and second electronic devices 534 and 544, and resistors 544 and 556 collectively form a cascode drive voltage generation circuit that generates the cascode drive voltage Vcsc in response to the control voltage VC during the active mode of operation. This cascode drive voltage generation circuit also generates the proper cascode drive voltage Vcsc during the power down mode of operation, as just described above.

Figure 6:
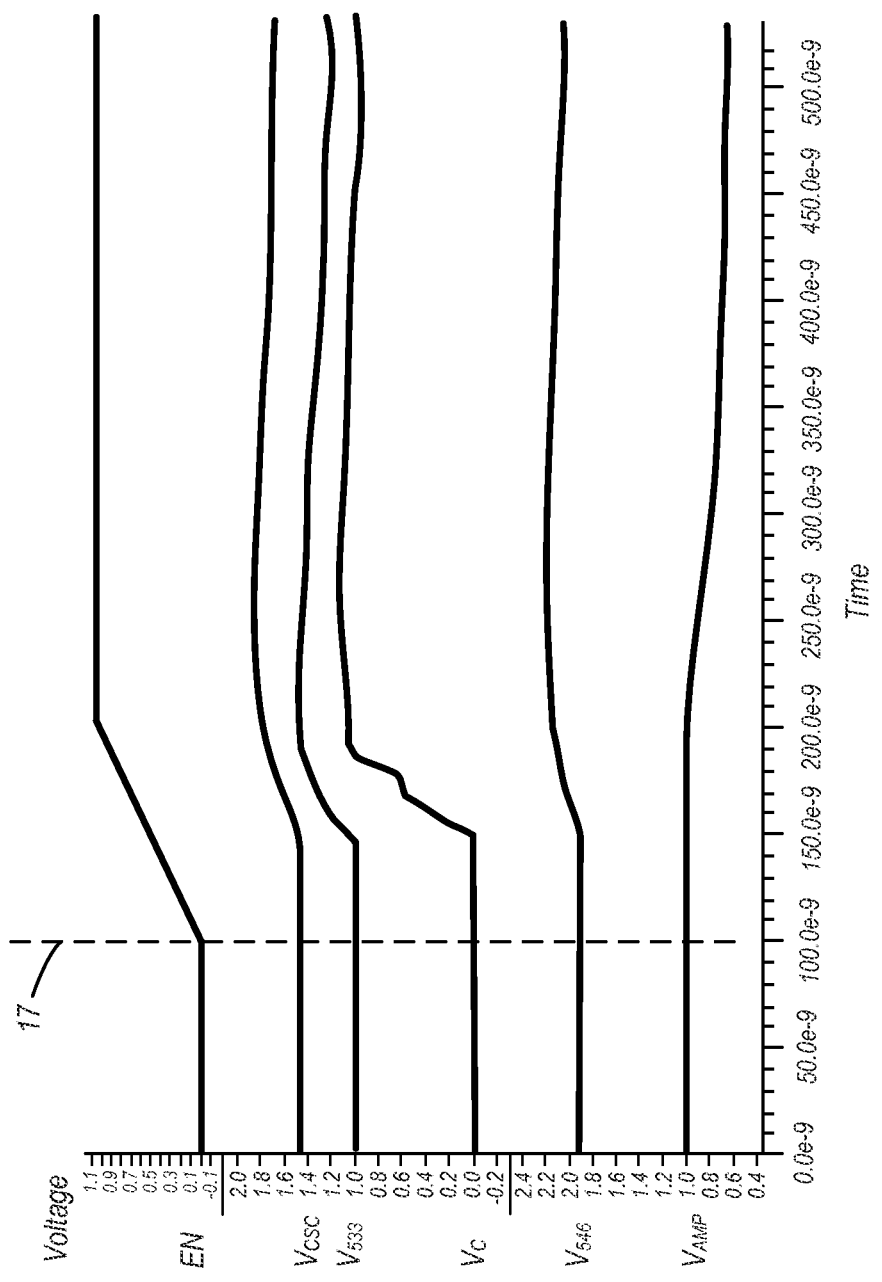
FIG. 6 is a signal timing diagram showing signals in the clock channel circuitry of FIG. 5A during operation of the clock channel circuitry.

FIG. 6 is a signal timing diagram showing signals in the clock channel 310 of FIG. 5A as a function of time during operation of the clock channel circuitry. The top signal shows the enable signal EN, the next signal down the cascode drive voltage Vcsc, then the next signal down shows a voltage $V_{533}$ corresponding to the voltage on the node 533 in FIG. 5A. The next signal down is the control voltage VC, which is the voltage across the resistor $R_{EXT}$ ($VC=R_{EXT} \times I_{BIAS}$) and then the voltage $V_{546}$ on the node 546 (interconnection of resistors 554, 556) is shown, and finally the voltage $V_{AMP}$ on the output of the operational amplifier 530.

As seen in FIG. 6, before a time t1 the EN signal is low, meaning the power harvesting control circuit 502 and communications and power harvesting circuit 500 are disabled or in a standby mode of operation. As previously mentioned, even during the standby mode the control circuit 502 generates the drive voltage Vcsc to protect thin oxide transistors in the transmitter 300 (FIG. 3A). Before time t1, the EN signal is low at approximately zero volts. Also notice that the control voltage VC corresponding to the voltage across the resistor $R_{EXT}$ is approximately zero voltage because the bias current $I_{BIAS}$ is approximately zero since both PMOS transistors 518 and 524 are turned OFF responsive to the AND gates 526, 528 driving their outputs high due to the low EN signal.

Notice before the time t1, the output voltage $V_{AMP}$ of the operational amplifier 530 is at approximately 1.0 V in the example of FIG. 6, where the harvested voltage $V_{HARV}$ is assumed to be approximately 1.0V. As mentioned above, with no bias current $I_{BIAS}$ flowing through the resistor $R_{EXT}$ the operational amplifier 530 drives the voltage $V_{AMP}$ high to try and turn OFF the PMOS transistor 532 in an attempt to increase the drive voltage Vcsc and thereby adjust the bias the NMOS transistors 516, 522 to increase the bias current. Also before time t1, the voltage $V_{546}$ on the node 546 is approximately 1.935 V and the voltage Vcsc is the threshold voltage $V_T$ of the diode-coupled transistor 544 less at approximately 1.468 V. The voltage $V_{533}$ on the node 533 is similarly the threshold voltage $V_T$ of the diode-coupled transistor less than the voltage Vcsc at approximately 1.0 V. At time t1 in FIG. 6 the EN signal goes high (actually begins ramping high) and the signals then go to the indicated levels pursuant to the operation of the power harvesting control circuit 502 previously described above.

Figure 7:
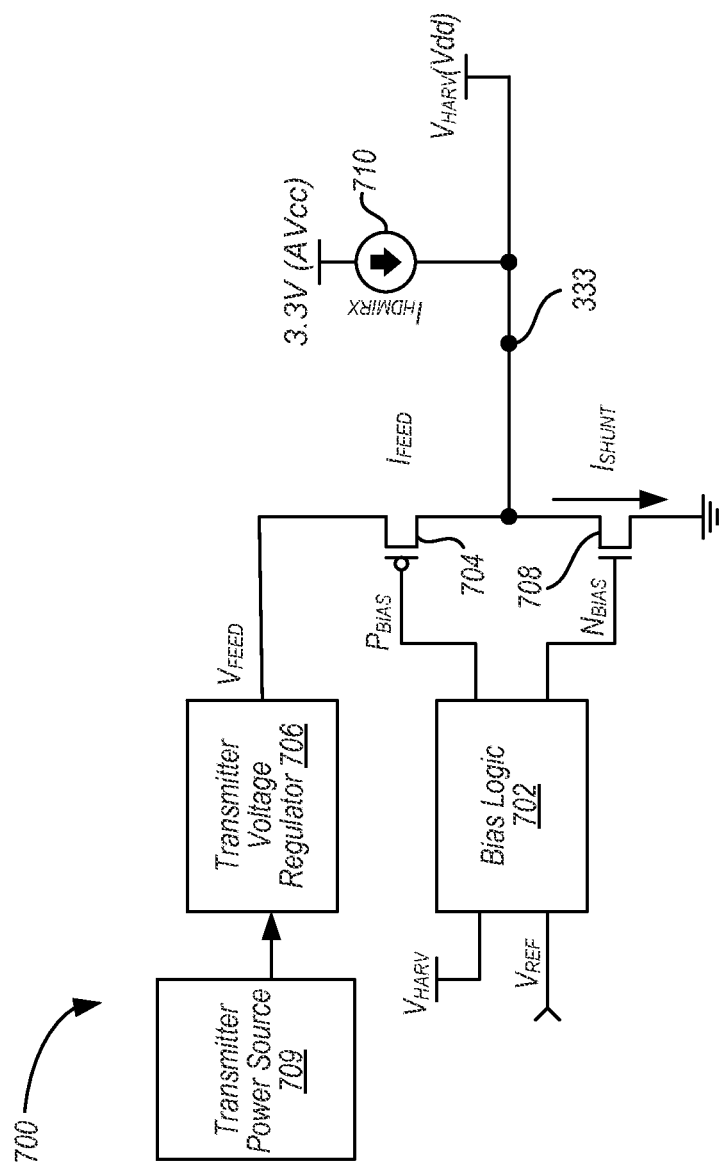
FIG. 7 is a schematic of a supplemental power feed circuit for an open drain transmitter circuit that provides supplemental power to the transmitter circuit when the power harvested from a receiver circuit is insufficient to adequately power the transmitter circuit.

FIG. 7 is a schematic of a supplemental power feed circuit 700 for the open drain transmitter circuit 300 of FIG. 3A that is operable to provide supplemental power to the transmitter circuit when the harvested voltage $V_{HARV}$ generated from the receiver circuit 120 (FIG. 1) is insufficient to adequately power the transmitter circuit, as will now be explained. The supplemental power feed circuit 700 is coupled to the node 333 on which the harvested voltage $V_{HARV}$ through the data channels 311-313 and the clock channel 310 of FIG. 3A as previously described. This is illustrated in FIG. 3A as briefly discussed above and will be described below in more detail with reference to FIGS. 7-10.

Referring to FIG. 7, the supplemental power feed circuit 700 includes bias logic circuitry 702 that is operable in response to the harvested voltage $V_{HARV}$ and a reference voltage $V_{REF}$ to control a power feed transistor 704 to supply a feed current $I_{FEED}$ from a transmitter voltage generator circuit 706 to the node 333 or to remove a shunt current $I_{SHUNT}$ current from the node 330 through a power shunt transistor 708. The power feed transistor 704 is a PMOS transistor and the power shunt transistor 708 an NMOS transistor in the embodiment of FIG. 7. The transmitter voltage regulator 706 is operable to generate a supplemental feed voltage $V_{FEED}$ from a power source 709 contained in the open drain transmitter 300. This power source 709 may, for example, be a battery where the open drain transmitter 300 including the supplemental power feed circuitry 700 is contained in a portable electronic device such as a camera or video recorder. The power source 709 may also correspond to an external power source coupled to the electronic device containing the open drain transmitter 300 and supplemental power feed circuit 700, such as an external power supply connected to the electronic device. The supplemental feed voltage $V_{FEED}$ and feed current $I_{FEED}$ generated by the transmitter voltage regulator 709 provide supplemental power for powering components in the open drain transmitter 300. In FIG. 7, a current source 710 is shown supplying a current $I_{HDMIRX}$ to the node 333 for generating the harvested voltage $V_{HARV}$ and represents the drive currents $I_{TX}$ supplied by each of the data channels 311-313 and the current ($I_{TX}-I_{BIAS}$) supplied by the clock channel 310 (FIG. 5A). Thus, in the example HDMI embodiment of the open drain transmitter circuit 300 of FIGS. 3A-5A the current $I_{HDMIRX}$ is equal to approximately 40 mA. The supply voltage AVcc from the transmitter 120 (FIG. 1) is 3.3 V in the example of FIG. 7.

In operation, power is harvested in the form of the drive current $I_{TX}$ from the data channels 311-313 and the clock channel 310 as previously described with reference to FIGS. 3A, 4A, and 5A. The harvested voltage $V_{HARV}$ is generated on the node 333 in response to the collective drive currents $I_{TX}$ from each of the channels 310-313. The bias logic circuitry 702 compares the harvested voltage $V_{HARV}$ to the reference voltage $V_{REF}$ and controls the power feed transistor 704 and power shunt transistor 708 in response to this comparison. The bias logic circuitry 702 generates a bias signal PBIAS that is applied to control the power feed transistor 704 and a bias signal NBIAS that is applied to control the power shunt transistor 708.

When the bias logic circuitry 702 determines that the harvested voltage $V_{HARV}$ is less than the reference voltage $V_{REF}$, the bias logic circuitry adjusts the value of the PBIAS signal applied to the power feed transistor 704 to turn ON that transistor or turn on that transistor more. In this way, the VFEED voltage from the transmitter voltage regulator 706 and a corresponding current is coupled to the node 333 through the power feed transistor 704 to thereby increase the value of the harvested voltage VHARV on this node. The bias logic circuitry 702 adjusts the PBIAS signal until the harvested voltage VHARV equals the desired reference voltage VREF. In this mode of operation, namely when the harvested voltage VHARV is less than the reference voltage VREF, the bias logic circuitry 702 adjusts the value of the PBIAS signal as just described and also drives the NBIAS signal low to turn OFF the power shunt transistor 708.

When the bias logic circuitry 702 determines that the harvested voltage $V_{HARV}$ is greater than the reference voltage $V_{REF}$, the bias logic circuitry adjusts the value of the NBIAS signal applied to the power shunt transistor 708 to turn ON that transistor or turn on that transistor more. In this way, the node 333 is coupled to ground through the power shunt transistor 708 to thereby draw current from this node and thereby decrease the value of the harvested voltage VHARV on the node. The bias logic circuitry 702 adjusts the NBIAS signal until the harvested voltage VHARV equals the desired reference voltage VREF. In this mode of operation, namely when the harvested voltage VHARV is greater than the reference voltage VREF, the bias logic circuitry 702 adjusts the value of the NBIAS signal as just described and also drives the PBIAS signal high to turn OFF the power feed transistor 704.

The supplemental power feed circuit 700 enables power to be harvested from the receiver 120 (FIG. 1) in the form of the drive currents ITX from the channels 310-313 to generate the harvested voltage VHARV for powering all components in the open drain transmitter 300 so long as sufficient power (i.e., drive current ITX) is available to generate the required harvested voltage. If a total current $I_{CONSO}$ consumed by circuitry or components in the open drain transmitter 300 being powered by the harvested voltage VHARV is less than the total drive current $I_{HDMIRX}$ ($I_{CONSO}<I_{HDMIRX}$), then the bias logic circuitry 702 turns ON the NMOS power shunt transistor 708 to shunt excess current to ground and maintain the harvested voltage VHARV at the desired value. The bias logic circuitry 702 keeps the PMOS power feed transistor 704 turned OFF in this situation. Conversely, if the total current $I_{CONSO}$ consumed by the components in the open drain transmitter 300 powered by the harvested voltage VHARV is greater than the total drive current $I_{HDMIRX}$ that is available from the transmitter 120 ($I_{CONSO}>I_{HDMIRX}$), then the bias logic circuitry 702 turns ON the PMOS power feed transistor 704 to supply extra current from the transmitter voltage regulator 706 to the node 333 and maintain the harvested voltage VHARV at the desired value. The bias logic circuitry 702 keeps the NMOS power shunt transistor 708 turned OFF in this situation. In this way, supplemental power from the transmitter voltage regulator 706 is only utilized when necessary to power the open drain transmitter 300.

As the frequency of the operation of the transmitter 300 increases, meaning data and clock signals are communicated over the channels 310-313 at higher frequencies, the components in the these channels and other components in the open drain transmitter 300 being powered by the harvested voltage VHARV draw more current (i.e., consume more power). For example, where the data channels 311-313 and clock channel 310 collective form an HDMI interface, the total current $I_{CONSO}$ consumed by circuitry or components in the open drain transmitter 300 powered by the harvested voltage VHARV is typically less than 40 mA when the HDMI interface is operating at less than 1.65 Gigabits per second (Gbps). When the speed of the HDMI interface increases to greater than 1.65 Gbps but less or equal to 3.4 Gbps, however, the total current $I_{CONSO}$ may increase to 60 mA or 15 mA per channel 310-313. As a result, more current is needed than is available from the receiver 120 (FIG. 1) to maintain the harvested voltage VHARV, which in this context corresponds to the voltage on the node 333 and not a truly "harvested" voltage since not all the current necessary to maintain this voltage at the desired value is available from the receiver 120. The same is true to an even greater extent when the HDMI interface is operating at even higher frequencies, namely greater than 3.4 Gbps, with perhaps 80 mA or 20 mA per channel 310-313 being drawn under these conditions. The supplemental power feed circuit 700 allows for operation at these higher frequencies by providing supplemental power from the transmitter voltage regulator 706 as necessary to maintain the voltage on the node 333 at the desired value. Where the drive current $I_{TX}$ from the transmitter 120 is greater than the current needed to power the components in the open drain transmitter 300 powered by the harvested voltage VHARV on the node 333, the supplemental power feed circuit 700 also shunts excess current to ground through the NMOS shunt transistor 708 to maintain the harvested voltage at the desired value.

Figure 8:
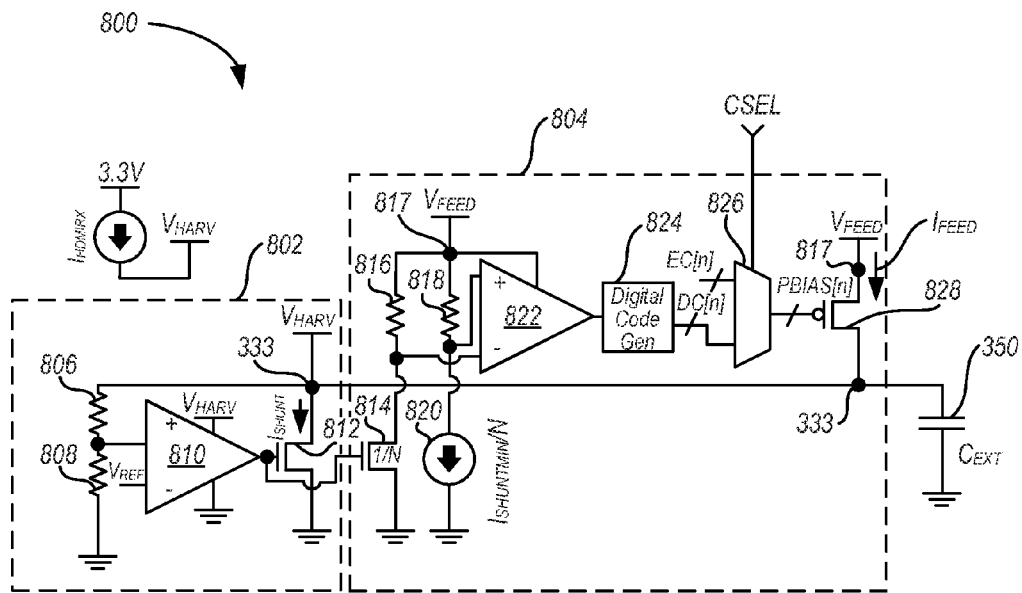
FIG. 8 is a schematic of a digital circuitry embodiment of the supplemental power feed circuit of FIG. 7.

FIG. 8 is a schematic of a digital supplemental power feed circuit 800 that corresponds to one embodiment of the supplemental power feed circuit 700 of FIG. 7. The supplemental power feed circuit 800 includes a shunt regulator 802 operable to sink or shunt current from the node 333 on which the harvested voltage VHARV is generated. A source or feed regulator 804 is operable to source or feed current to the node 333 when supplemental current from the transmitter voltage regulator 706 (FIG. 7) is required to maintain the required harvested voltage VHARV. The external capacitor 350 (FIG. 3A) is also shown coupled to the node 333 in FIG. 8. The shunt regulator 802 includes a resistor divider formed by two resistors 806 and 808 connected in series between the node 333 and ground. An operational amplifier 810 has a non-inverting input coupled to the node interconnecting the two resistors 806 and 808 to receive the divided voltage on the node 333 while an inverting input of the operational amplifier 810 receives the reference voltage VREF. An output of the operational amplifier 810 controls a shunt transistor 812 coupled between the node 333 and ground to thereby control a shunt current ISHUNT flowing from the node 333 through the shunt transistor to ground.

The output of the operational amplifier 810 also controls a transistor 814 contained in the feed regulator 804. The transistor 814 is coupled in series with a resistor 816 between a node 817 on which the supplemental feed voltage $V_{FEED}$ is supplied (i.e., the node 817 corresponds to the output of the transmitter voltage regulator 706 of FIG. 7). The transistor 814 is sized relative to the transistor 812 such that for the same control or gate voltage the current flowing through the transistor 812 from drain to source is 1/N the shunt current $I_{SHUNT}$ flowing through the transistor 812, where N is an integer value. The feed regular 804 further includes a resistor 818 and constant current source 820 coupled in series between the node 817 and ground. The resistors 816 and 818 have the same value and the constant current through the constant current source 820 is equal to a minimum shunt current $I_{SHUNTMIN}$ divided by N ($I_{SHUNTMIN}/N$), where the minimum shunt current is as its name implies the minimum value for the shunt current $I_{SHUNT}$ flowing through the transistor 812.

An error amplifier 822 in the form of a comparator in the embodiment of FIG. 8 has an inverting input coupled to the node between the resistor 816 and the transistor 814 and has a non-inverting input coupled to the node between the resistor 818 and the constant current source 820. A digital code generator 824 receives the output of the error amplifier 822 and generates a digital code DC[n] having n bits in response to this output. The digital code DC[n] is applied to one input of a multiplexer 826 that provides an n-bit bias word PBIAS[n]. The PBIAS[n] word is applied to "n" parallel-connected feed transistors 828 coupled between the node 817 on which the VFEED voltage is provided and the node 333 on which the harvested voltage VHARV is generated. Only one feed transistor 828 is shown in FIG. 8 for the sake of simplifying the figure, but in this embodiment n feed transistors 828 are coupled in parallel between the node 817 and node 333, each one of these n feed transistors receiving a signal on its gate corresponding to one of the n-bits in the PBIAS[n] word. In one embodiment, the digital code is a counter that generates the digital code DC[n] responsive to the output of the error amplifier 822. The digital code generator 824 may utilize any suitable type of coding, such as thermometric coding, binary coding, and so on. An n-bit external code EC[n] is supplied to a second input of the multiplexer 826 and is a code that is generated by other circuitry (not shown) in the transmitter 300. The external code EC[n] may, for example, be stored in a lookup table stored in the transmitter 300. A code selection signal CSEL received from other circuitry in the open drain transmitter 300 (FIG. 3A) containing the supplemental power feed circuit 800 controls the multiplexer to output either the external code EC[n] or the calculated digital code DC[n] as the PBIAS[n] word. During startup of the transmitter 300, for example, the CSEL signal may controls the multiplexer 826 to output the external code EC[n] and then after a time period the CSEL signal may change state so that the generated digital code DC[n] is used in controlling the feed regulator 804.

In operation, assume initially that the supplemental power feed circuit 800 is in equilibrium, meaning that the harvested voltage VHARV has the desired value and that the shunt current ISHUNT through the shunt transistor 812 is equal to ISHUNTMIN ($I_{SHUNT}=I_{SHUNTMIN}$). Also assume initially that the CSEL signal selects the digital code DC[n] from the code generator 824. In this situation, the operational amplifier 810 drives its output to a voltage level to turn ON the shunt transistor 812 so that the shunt current $I_{SHUNTMIN}$ flows through this transistor. The output of the operational amplifier 810 is also applied to the transistor 814 such that the current through this transistor is equal to ($I_{SHUNTMIN}/N$). As a result, the current ($I_{SHUNTMIN}/N$) flows through the resistor 816 and transistor 814 as well as the resistor 818 due to the constant current source 820. Thus, the voltages at the non-inverting and inverting inputs of the error amplifier 822 are equal, causing the error amplifier to generate an output and the digital code generator 824 to generate the digital code DC[n] that turns OFF all the feed transistors 828. No excess current $I_{FEED}$ from the transmitter voltage regulator 706 (FIG. 7) is needed in this situation so all the parallel-connected feed transistors 828 are deactivated through the digital code DC[n].

Now assume the total current ICONSO consumed by all components in the transmitter 300 being powered by the harvested voltage VHARV becomes greater than the total drive current IHDMIRX that the receiver 120 can supply (i.e., ($I_{CONSO}>I_{HDMIRX}$). In this situation, the harvested voltage VHARV on the node 333 begins to drop as current is drawn from this node to power components in the transmitter 300. As the value of the VHARV voltage on the node 333 begins to decrease the voltage at the non-inverting input of the operational amplifier 810 also decreases through the voltage divider formed by resistors 806, 808. In response to this decreased voltage at the non-inverting input, the amplifier 810 drives its output lower to reduce the shunt current ISHUNT through the shunt transistor 812. Since sufficient current is already being drawn from the node 333 to cause the harvested voltage VHARV to drop, the shunt current ISHUNT through shunt transistor 812 is lowered in an attempt to increase the harvested voltage.

Also in response to the output of the amplifier 810 being driven lower the transistor 814 is controlled to reduce the current through this transistor. This lower current through the transistor 814 results in a lower current through the resistor 816 and therefore a higher voltage at the inverting input of the error amplifier 822 relative to the voltage at the non-inverting input of the error amplifier. As a result, the error amplifier 822 drives its output low when the error amplifier is a comparator as is the case in the embodiment of FIG. 8. In response to the low output from the error amplifier 822, the code generator 824 generates the digital code DC[n] and this code is applied through the multiplexer 826 and output as the PBIAS[n] word to activate or turn ON at least some of the parallel-connected feed transistors 828. In response to the turned ON feed transistors 828, the feed current $I_{FEED}$ is collectively supplied through these activated shunt transistors from the feed voltage VFEED generated by the transmitter voltage regulator 706 to the node 333. The value of the feed current $I_{FEED}$ depends on the number and sizes of the feed transistors 828 that are activated.

The supplemental power feed circuit 800 continues operating in this manner until the required amount of supplemental power in the form of the feed current $I_{FEED}$ from the feed voltage VFEED has been supplied to the node 333 to adjust the harvested voltage VHARV to the desired value. The digital code generator 824 keeps updating the value of the digital code DC[n] based on the output of the error amplifier 824. So, for example, if the feed current $I_{FEED}$ flowing through the feed transistors 828 initially activated does not result in the harvested voltage VHARV increasing to the desired value, the digital code generator 824 will generate a subsequent digital code DC[n] to turn ON more of the feed transistors 828. The digital code DC[n] is sequentially updated in this way until enough feed current $I_{FEED}$ is supplied through the activated feed transistors 828 to drive the harvested voltage VHARV to its desired value.

Now assume the total current ICONSO consumed by all components in the transmitter 300 being powered by the harvested voltage VHARV becomes less than the total drive current IHDMIRX that the receiver 120 ((FIG. 1) can supply (i.e., ICONSO<IHDMIRX). In this situation, excess drive current ITX will be supplied to the node 333 so the shunt transistor 812 must then increase the value of the shunt current $I_{SHUNT}$ to discharge this node and keep the $V_{HARV}$ voltage at the desired value. Initially, the value of the VHARV voltage on the node 333 will begin to increase due to excess drive current $I_{TX}$ being supplied to the node 333, resulting in the voltage at the non-inverting input of the operational amplifier 810 also increasing through the voltage divider formed by resistors 806, 808. In response to this increased voltage at the non-inverting input, the amplifier 810 drives its output higher to turn ON the shunt transistor 812 more and in this way increase the shunt current ISHUNT through this transistor. Also, in response to the output of the amplifier 810 being driven higher the transistor 814 turns ON harder so that the current through this transistor increases. As a result of the increased current through the transistor 814 the current through the resistor 816 increases accordingly and the voltage at the inverting input of the error amplifier 822 therefore becomes less than the voltage at the non-inverting input, which causes the error amplifier to drive its output high.

In response to the high output from the error amplifier 822, the code generator 824 generates the digital code DC[n] and this code is applied through the multiplexer 826 and output as the PBIAS[n] word to deactivate at least some of the parallel-connected feed transistors 828. The code generator 824 is assumed to generate the digital code DC[n] to deactivate all of the feed transistors 828 in the present description. In other embodiments, however, the digital code generator 824 may gradually turn OFF selected ones of the parallel-connected feed transistors 828 to gradually ramp down the feed current $I_{FEED}$ being supplied to the node 333 until eventually all the shunt transistors have been deactivated. Once all the feed transistors 828 are turned OFF so that no feed current $I_{FEED}$ is supplied to the node 333, the operational amplifier 810 continues automatically adjusting the value of the shunt current $I_{SHUNT}$ using the feedback of the harvested voltage $V_{HARV}$ via the voltage divider formed by resistors 806, 808. The operational amplifier 810 continues operating in this way until the harvested voltage $V_{HARV}$ reaches the desired value, at which point the shunt current $I_{SHUNT}$ through the shunt transistor 812 equals $I_{SHUNTMIN}$ ($I_{SHUNT}=I_{SHUNTMIN}$) and the current through the transistor 814 equals $I_{SHUNTMIN}/N$. Note that where the CSEL signal causes the multiplexer 826 to select the external code word EC[n], the value of this code word sets the feed current $I_{FEED}$ collectively supplied by the feed transistors 828 independent of the shunt current $I_{SHUNT}$ and value of the harvested voltage $V_{HARV}$.

Figure 9:
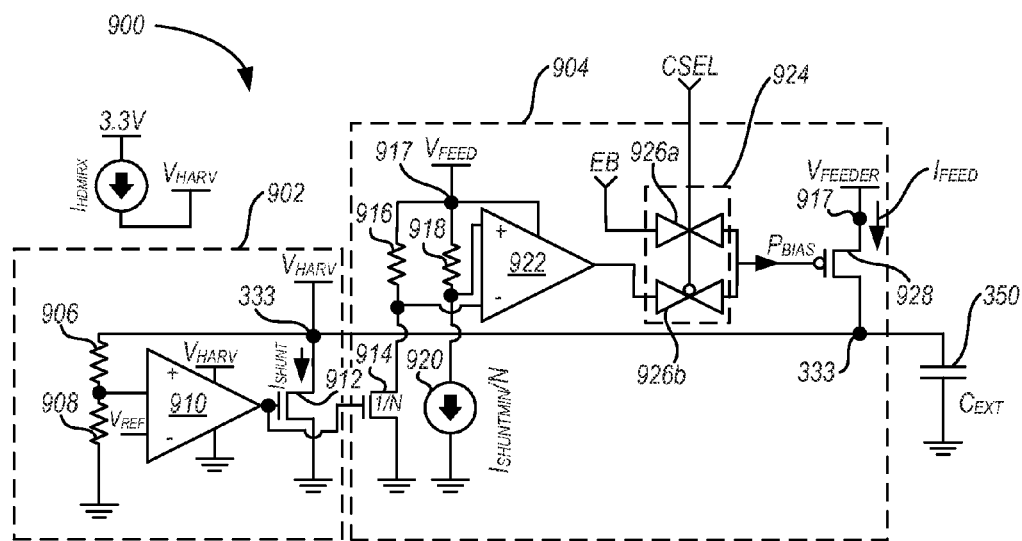
FIG. 9 is a schematic of an analog circuitry embodiment of the supplemental power feed circuit of FIG. 7.

FIG. 9 is a schematic of an analog supplemental power feed circuit 900 that corresponds to another embodiment of the supplemental power feed circuit 700 of FIG. 7. The supplemental power feed circuit 900 includes components 902-920 that are identical to or similar to the corresponding components 802-820 previously described with reference to the embodiment of FIG. 8. Accordingly, the operation of these components 902-921 is not again described in detail with reference to FIG. 9. The power feed circuit 900 is an analog embodiment because instead of the digital components 822-826 in the embodiment of FIG. 8 the embodiment of FIG. 9 utilizes analog circuitry to perform the function of these components.

An error amplifier 922 is an operational amplifier in the supplemental power feed circuit 900 and has a non-inverting input coupled to the node at the interconnection of the resistor 918 and the constant current source 920 and an inverting input coupled to the node at the interconnection of the resistor 916 and the transistor 914. In operation, the error amplifier 922 generates an analog output signal indicating whether the harvested voltage $V_{HARV}$ on the node 333 is higher or lower than the desired value. The analog output signal from the error amplifier 922 is supplied as one input to an analog multiplexer 924 including two complementary pass gates 926A and 926B. An analog external bias signal EB is applied to a second input of the analog multiplexer 924 where the EB signal is a signal that is generated by other circuitry (not shown) in the transmitter 300. The EB signal may, for example, be generated by a voltage reference circuit or a digital code stored in a lookup table and supplied to a digital-to-analog converter. A code selection signal CSEL received from other circuitry in the open drain transmitter 300 (FIG. 3A) controls the multiplexer to output either the external analog output from the error amplifier 922 or the EB signal as an analog bias signal PBIAS that is applied to a feed transistor 928 coupled between the node 917 on which the feed voltage $V_{FEED}$ is supplied or the EB signal. The feed transistor 928 supplies the feed current $I_{FEED}$ to the node 333 in response to the PBIAS signal.

In operation, assume initially that the supplemental power feed circuit 900 is in equilibrium, meaning the harvested voltage VHARV has the desired value and the shunt current $I_{SHUNT}$ through the shunt transistor 912 is equal to $I_{SHUNTMIN}$ ($I_{SHUNT} = I_{SHUNTMIN}$). Also assume the CSEL signal selects the output from the error amplifier 922. In this situation, the operational amplifier 910 drives its output to a voltage level to turn ON the shunt transistor 912 so that the shunt current $I_{SHUNT}$ flows through this transistor. The output of the operational amplifier 910 is also applied to the transistor 914 such that the current through this transistor is equal to ($I_{SHUNTMIN}/N$). As a result, the current ($I_{SHUNTMIN}/N$) flows through the resistor 916 and transistor 914 as well as the resistor 918 due to the constant current source 920. Thus, the voltages at the non-inverting and inverting inputs of the error amplifier 922 are approximately equal, causing the error amplifier to generate a corresponding an analog output signal that is has voltage level sufficient to turn OFF the PMOS feed transistor 928 when the CSEL signal control the analog multiplexer 924 to provide the output of the error amplifier as the PBIAS signal. No excess current $I_{FEED}$ from the transmitter voltage regulator 706 (FIG. 7) is needed in this situation so the feed transistor 928 is turned OFF Now assume the total current $I_{CONSO}$ consumed by all components in the transmitter 300 being powered by the harvested voltage VHARV becomes greater than the total drive current $I_{HDMIRX}$ that the receiver 120 (FIG. 1) can supply (i.e., ($I_{CONSO} > I_{HDMIRX}$). In this situation, the harvested voltage $V_{HARV}$ on the node 333 begins to drop as current is drawn from this node to power components in the transmitter 300. As the value of the $V_{HARV}$ voltage on the node 333 begins to decrease the voltage at the non-inverting input of the operational amplifier 910 also decreases through the voltage divider formed by resistors 906, 908. In response to this decreased voltage at the non-inverting input, the amplifier 910 drives its output lower to reduce the shunt current $I_{SHUNT}$ through the shunt transistor 912. Since sufficient current is already being drawn from the node 333 to cause the harvested voltage $V_{HARV}$ to drop, the shunt current $I_{SHUNT}$ through shunt transistor 912 is lowered to increase the harvested voltage.

Also in response to the output of the amplifier 910 being driven lower the transistor 914 is controlled to reduce the current through this transistor. This lower current through the transistor 914 results in a lower current through the resistor 916 and therefore a higher voltage at the inverting input of the error amplifier 922 relative to the voltage at the non-inverting input of the error amplifier. As a result, the error amplifier 922 drives its analog output signal to a lower voltage level. This low output signal from the error amplifier 922 is applied through the analog multiplexer 926 and output as the PBIAS signal to activate or turn ON feed transistor 928. In response to the turned ON feed transistors 828, the feed current $I_{FEED}$ is supplied through the feed transistor from the feed voltage $V_{FEED}$ generated by the transmitter voltage regulator 706 and supplied to the node 333. The value of the feed current $I_{FEED}$ depends on the voltage level of the output of the error amplifier 922. In this way, the supplemental power feed circuit 900 continues operating in this manner until the output of the error amplifier 922 applies results in a PBIAS signal applied to the feed transistor 928 such that the harvested voltage VHARV has the desired value.

Now assume the total current ICONSO consumed by all components in the transmitter 300 being powered by the harvested voltage VHARV becomes less than the total drive current IHDMIRX that the receiver 120 ((FIG. 1) can supply (i.e., ICONSO<IHDMIRX). In this situation, excess drive current ITX will be supplied to the node 333 so the shunt transistor 912 must increase the value of the shunt current $I_{SHUNT}$ to discharge this node and keep the $V_{HARV}$ voltage at the desired value. Initially, the value of the VHARV voltage on the node 333 will begin to increase due to excess drive current $I_{TX}$ being supplied to the node 333, resulting in the voltage at the non-inverting input of the operational amplifier 910 also increasing through the voltage divider formed by resistors 906, 908. In response to this increased voltage at the non-inverting input, the amplifier 910 drives its output higher to turn ON the shunt transistor 912 more and in this way increase the shunt current ISHUNT through this transistor. Also, in response to the output of the amplifier 810 being driven higher the transistor 914 turns ON harder so that the current through this transistor increases. As a result of the increased current through the transistor 914 the current through the resistor 916 increases accordingly and the voltage at the inverting input of the error amplifier 922 therefore becomes less than the voltage at the non-inverting input, which causes the error amplifier to drive its output higher so that the resulting PBIAS signal applied to the feed transistor 928 will begin turning OFF the feed transistor. The amplifier 910 continues operating this manner to adjust the value the shunt current ISHUNT and the error amplifier continued adjusting its output signal to result in a PBIAS signal that reduces the feed current IFEED through the feed transistor 928 until the harvested voltage VHARV has the desired value. Note that where the CSEL signal causes the multiplexer 926 to select the external bias signal EB, the value of this signal sets the feed current $I_{FEED}$ supplied by the feed transistor 928 independent of the shunt current $I_{SHUNT}$ and value of the harvested voltage $V_{HARV}$.

Figure 10:
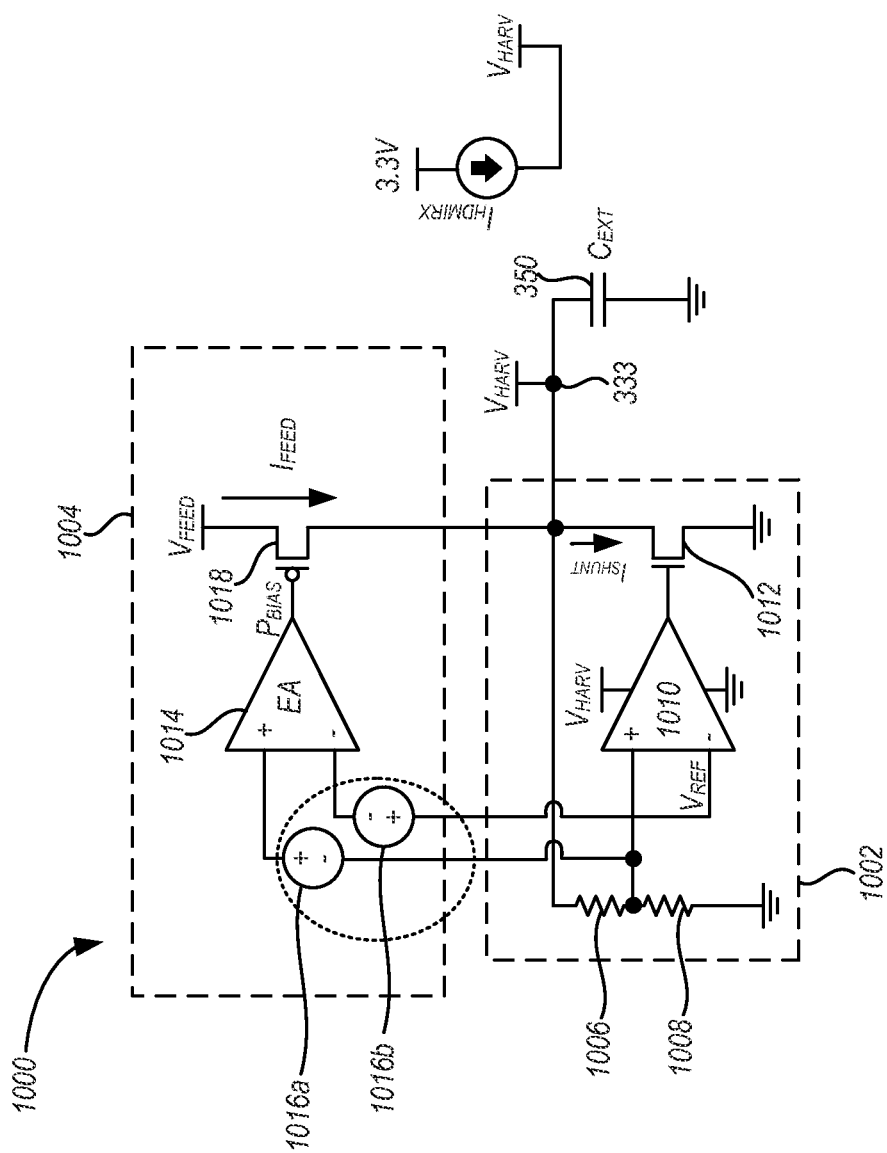
FIG. 10 is a schematic of the supplemental power feed circuit of FIG. 7 in which a harvested voltage value is sensed to control the operation of the power harvesting circuitry according to another embodiment of the present disclosure.

FIG. 10 is a schematic of a supplemental power feed circuit 1000 that corresponds to yet another embodiment of the circuit 700 of FIG. 7. The circuits 800 and 900 of FIGS. 8 and 9 sense the shunt current $I_{SHUNT}$ either through the digital comparator 822 in FIG. 8 or the analog error amplifier 922 in FIG. 9 and control the operation of these circuits responsive to this sense shunt current. In contrast, the supplemental power feed circuit 1000 senses the value of the harvest voltage VHARV on the node 333 and controls the feeding and shunting of current to and from this node to thereby control the value of the harvest voltage, as will now be explained in more detail. In this way, the circuit 900 functions as a voltage regulator of the harvested voltage VHARV.

The supplemental power feed circuit 1000 includes a shunt regulator 1002 that controls the shunt current ISHUNT discharged from the node 333 and includes a feed regulator 1004 that controls the feed current supplied to the node 333 on which the harvested voltage VHARV is generated. The shunt regulator 1002 includes a voltage divider formed by resistors 1006 and 1008 and an operational amplifier 1010 and shunt transistor 1012 interconnected in the same way as previously described for corresponding components in the supplemental power feed circuits 800 900 of FIGS. 8 and 9. Accordingly, the detailed operation of these components 1006-1012 will not again be described in detail herein. The feed regulator 1004 includes an error amplifier 1014 formed by an operational amplifier having a non-inverting input coupled to the node defined at the interconnection of the resistors 1006 and 1008 and having an inverting input coupled to receive the reference voltage VREF supplied to the inverting input of the amplifier 1010.

The circuit 1000 further includes two offset voltage circuits 1016A and 1016B that provide a voltage offset from the voltages at the non-inverting and inverting inputs of the amplifier 1010. In this way, if the offset voltage circuits 1016A, 1016B are utilized the voltages at the non-inverting and inverting inputs of the error amplifier 1014 will have the voltage offset provided by these offset voltage circuits relative to the voltages on the non-inverting an inverting inputs of the amplifier 1010. The error amplifier 1014 generates a bias signal PBIAS in response to the signals on its inputs and applies the PBIAS signal to control a feed transistor 1018 that supplies the feed current IFEED to the node 333. The offset voltage circuits 1016A, 1016B function to ensure that both the shunt transistor 1012 and the feed transistor 1018 are not turned ON at the same time. If this was not true the circuit 1000 could reach a quiescent or equilibrium operating point where the feed transistor 1018 is supplying a significant feed current IFEED and the shunt transistor 1012 is sinking a significant shunt current ISHUNT. This could result in overheating and damage of the transistors 1012, 1018 as well as other circuitry in the transmitter 300, and even if no damage occurs such a situation would result in a significant waste of power. The offset voltage circuits 1016A, 1016B avoid this situation and can be implemented as an offset in the reference voltage VREF or an offset in the amplifier 1014, or elsewhere in the circuit 1000.

In operation, assume that the supplemental power feed circuit 1000 is initially in equilibrium meaning that the harvested voltage VHARV on the node 333 has the desired value and that the shunt current through the shunt transistor 1012 is equal to a minimum shunt current ISHUNTMIN. In this equilibrium state, the feed current IFEED has a zero value so that power generated by the transmitter voltage regulator 706 (FIG. 7), which generates the feed voltage VFEED and supplies the feed current IFEED, is not wasted.

Now assume the total current ICONSO consumed by all components in the transmitter 300 being powered by the harvested voltage VHARV becomes greater than the total drive current IHDMIRX that the receiver 120 (FIG. 1) can supply (i.e., ICONSO>IHDMIRX). In this situation, the harvested voltage VHARV on the node 333 begins to drop as current is drawn from this node to power components in the transmitter 300. As the value of the VHARV voltage on the node 333 begins to decrease the voltage at the non-inverting input of the operational amplifier 1010 also decreases through the voltage divider formed by resistors 1006, 1008. In response to this decreased voltage at the non-inverting input, the amplifier 1010 drives its output lower to reduce the shunt current ISHUNT through the shunt transistor 1012. Since sufficient current is already being drawn from the node 333 to cause the harvested voltage VHARV to drop, the shunt current ISHUNT through shunt transistor 912 is lowered to increase the harvested voltage.

The error amplifier 1014 also receives the lower voltage at the non-inverting input of the operational amplifier 1010, and in response to this lower voltage the error amplifier drives the PBIAS signal to a lower voltage level to thereby turn ON the feed transistor 1018 and increase the feed current IFEED supplied to the node 333. The operational amplifier 1010 and error amplifier 1014 continue operating in this manner, with the operational amplifier 1010 controlling its output to reduce the shunt current ISHUNT and the error amplifier 1014 controlling the PBIAS signal to increase the feed current IFEED until the harvested voltage VHARV on the node 333 has the desired value.

If the total current ICONSO consumed by all components in the transmitter 300 being powered by the harvested voltage VHARV now then becomes less than the total drive current IHDMIRX that the receiver 120 can supply (i.e., (ICONSO<IHDMIRX), the supplemental power feed circuit operates in the same way but in a reverse manner to increase the shunt current ISHUNT and decrease the feed current IFEED until the harvested voltage again equals the desired value. More specifically, if the total current ICONSO becomes less than the drive current IHDMIRX then excess current will be supplied to the node 333, resulting in the harvested voltage VHARV initially increasing. As the harvested voltage VHARV increases, the voltage supplied to the non-inverting input of the operational amplifier 1010 will likewise increase through the voltage divider formed by the resistors 1006 and 1008. In response to this increased voltage on its non-inverting input, the operational amplifier 1010 will drive its output to a higher voltage level, turning ON the shunt transistor 1012 harder to thereby increase the shunt current ISHUNT. At the same time, in response to the higher voltage at the non-inverting input of the amplifier 1010 the error amplifier will drive the PBIAS signal to a higher voltage level to lower the feed current IFEED. Again, the regulators 1002 and 1004 continue operating in this way until equilibrium is reached, meaning the harvested voltage VHARV has its desired value and the shunt current ISHUNT has its minimum value required to maintain the harvested voltage at the desired value and the feed current IFEED is approximately zero.

Figure 11:
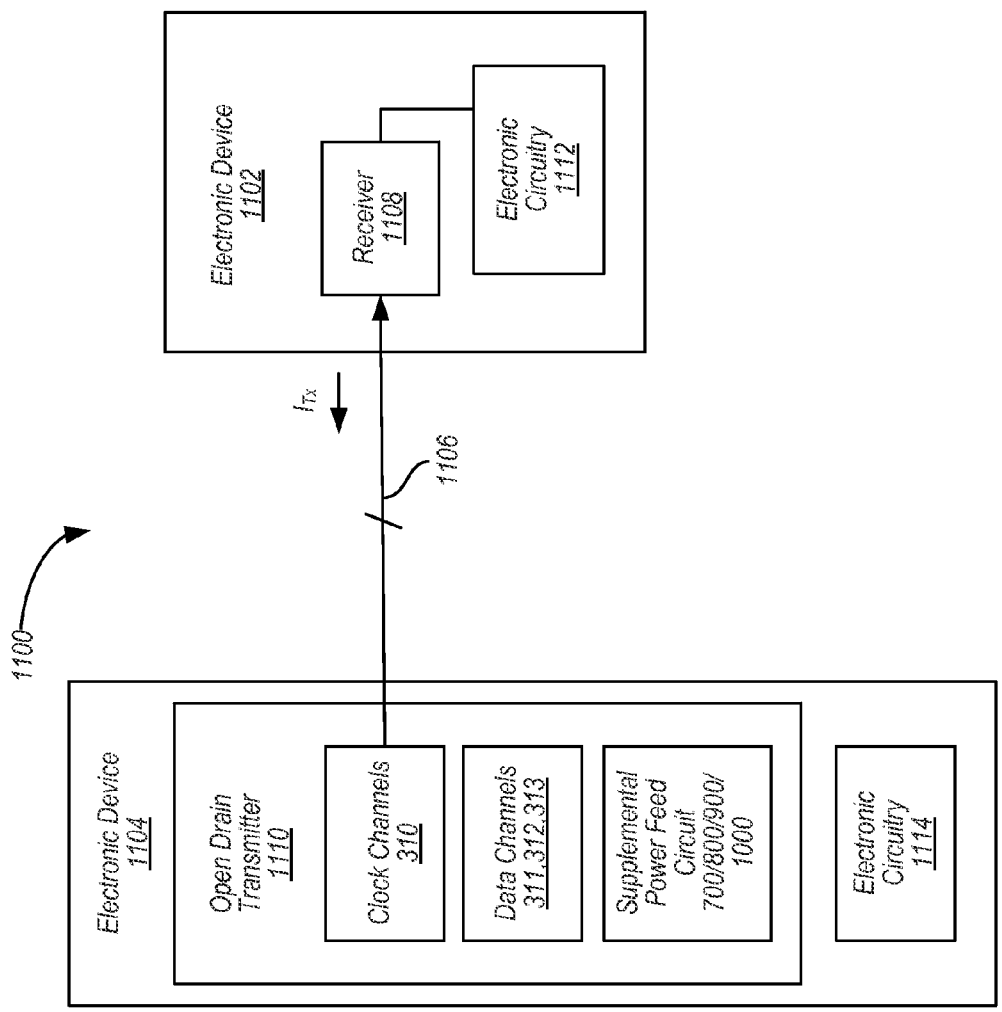
FIG. 11 is a block diagram of an electronic system including transmitter and receiver circuitry containing the power harvesting circuitry of one or more of the embodiments of FIGS. 6-10 according to another embodiment of the present disclosure.

FIG. 11 is a functional block diagram of an electronic system 1100 including a first electronic device 1102 and a second electronic device 1104 interconnected through a communications channel 1106. In the embodiment of FIG. 11, the communications channel 1106 is assumed to be an HDMI communications channel and thus includes three data channels and a clock channel as previously described with reference to FIG. 3A. The electronic device 1102 includes a receiver 1108 corresponding to the receiver 120 of FIG. 1 and thus this receiver supplies drive current ITX to power an open drain transmitter 1110 contained in the electronic device 1104. The electronic device 1102 may, for example, be a television including an HDMI port while the device 1104 may, for example, be a digital camera, camcorder, or smart phone also containing an HDMI port for coupling to the electronic device 1102 through the HDMI channel 1106. The open drain transmitter 1110 corresponds to embodiments of the open drain transmitter circuit 300 previously described with reference to FIG. 3A and includes the clock channel 310 described with reference to this circuit and with reference to FIGS. 5A and 5B. The open drain transmitter 1110 also includes the three data channels 311-313 as previously described with reference to FIG. 3A and FIG. 4A. In addition, the open drain transmitter 1110 includes one of the supplemental power feeds circuits 700, 800, 900 and 1000 of FIGS. 7, 8, 9 and 10, respectively.

The electronic device 1102 further includes electronic circuitry 1112 coupled to the receiver to receive data transmitted from the transmitter 1110 over the HDMI channel 1106. This electronic circuitry 1112 will vary depending on the type of the electronic device 1102. For example, where the electronic device 1102 is a television the electronic circuitry 1112 will typically include a video display, such as an LCD or LED screen, user interface components, communications components, power components, and so on. Similarly, the electronic device 1102 may be a camera or smart phone and includes electronic circuitry 1114 that varies depending on the type of the electronic device 1104. For example, where the electronic device 1104 is a smart phone the electronic circuitry 1114 will typically include a video display, such as an LCD or LED screen, a touch screen user interface, telephone components, GPS components, power components, and so on.

As already mentioned above, embodiments of the present disclosure are not limited to HDMI interfaces or channels. Thus, in the electronic system 1100 of FIG. 11 the communications channel 1106 may be a communications channel other than an HDMI channel. Accordingly, more or fewer clock channels and more or fewer data channels may be contained in the open dream transmitter 1110 in the electronic device 1104 in other embodiments of the present disclosure.

United States Patent Application Publication No. 2012/0169403 A1 published 5 Jul. 2012, the invention of which was invented by one of the inventors of the present disclosure, discloses one approach for power harvesting in open drain transmitters, and is incorporated herein by reference in its entirety.

Even though various embodiments and advantages of the described embodiments have been set forth in the foregoing description, the above disclosure is illustrative only, and changes may be made in detail and yet remain within the broad principles of the present disclosure. For example, although three data channel and a clock channel are contained in the embodiment of FIG. 3A other embodiments may include more or fewer data channels, and more or fewer clock channels. The present disclosure is to be limited only by the appended claims.

What is claimed is:

1. An open drain transmitter, comprising:
   at least one data channel, each data channel operable to communicate data and to provide a drive current that is received over the data channel and is used in generating a harvested voltage on a harvested node, and the value of the drive current being a function of a cascode drive voltage;
   a clock channel operable to communicate a clock signal and including:
      a communications and power harvesting circuit operable to communicate a clock signal and to provide a drive current that is received over the clock channel and is used in generating the harvested voltage, and the value of the drive current being a function of the cascode drive voltage, and
      a power harvesting control circuit coupled to the clock channel to receive a bias current over the clock channel and operable in an active mode to generate the cascode drive voltage responsive to this bias current and operable in a power down mode to generate the cascode drive voltage having a value that ensures that the maximum tolerable junction voltage is not exceeded for transistors in the clock and data channels, wherein the power harvesting control circuit comprises:
         a first transistor having first and second signal nodes and a control node, the first signal node coupled to a first complementary clock line of the clock channel and the control node receiving the cascode drive voltage;
         a second transistor having first and second signal nodes and a control node, the first signal node coupled to a second complementary clock line of the clock channel and the control node receiving the cascode drive voltage;
         a third transistor having a first signal node coupled to the second signal node of the first transistor and having a second signal node coupled to a bias node, and having a control node adapted to receive a first complementary clock signal;
         a fourth transistor having a first signal node coupled to the second signal node of the second transistor and having a second signal node coupled to the bias node, and having a control node adapted to receive a second complementary clock signal;
         an external resistor coupled between the bias node and a reference voltage source;
      wherein a bias current of the clock channel is operable to flow from the corresponding complementary clock line through the corresponding first or second transistor and through the activated one of the third and fourth transistors to the bias node and through the external resistor to generate a control voltage; and
   a cascode drive voltage generation circuit coupled to the bias node and operable to generate the cascode drive voltage responsive to the control voltage during an active mode of operation and operable during a power down mode of operation to generate the cascode drive voltage having a value that is a function of a pull-up voltage applied on the complementary clock lines and of the harvested voltage.

2. The open drain transmitter of claim 1, wherein each data channel comprises:
   a first transistor having first and second signal nodes and a control node, the first signal node coupled to a first complementary data line of the data channel and the control node receiving the cascode drive voltage;
   a second transistor having first and second signal nodes and a control node, the first signal node coupled to a second complementary data line of the data channel and the control node receiving the cascode drive voltage;
   a third transistor having a first signal node coupled to the second signal node of the first transistor and having a second signal node coupled to the harvested node, and having a control node adapted to receive a first complementary data signal;
   a fourth transistor having a first signal node coupled to the second signal node of the second transistor and having a second signal node coupled to the harvested node, and having a control node adapted to receive a second complementary data signal; and
   wherein the drive current of the data channel is operable to flow from the corresponding complementary data line through the corresponding first or second transistor and through the activated one of the third and fourth transistors to the harvested node.

3. The open drain transmitter of claim 1, wherein the communications and power harvesting circuit comprises:
   a first transistor having first and second signal nodes and a control node, the first signal node coupled to a first complementary clock line of the clock channel and the control node receiving the cascode drive voltage;
   a second transistor having first and second signal nodes and a control node, the first signal node coupled to a second complementary clock line of the clock channel and the control node receiving the cascode drive voltage;
   a third transistor having a first signal node coupled to the second signal node of the first transistor and having a second signal node coupled to the harvested node, and having a control node adapted to receive a first complementary clock signal;
   a fourth transistor having a first signal node coupled to the second signal node of the second transistor and having a second signal node coupled to the harvested node, and having a control node adapted to receive a second complementary clock signal; and
   wherein the drive current of the clock channel is operable to flow from the corresponding complementary clock line through the corresponding first or second transistor and through the activated one of the third and fourth transistors to the harvested node.

4. The open drain transmitter of claim 1, wherein the cascode drive voltage generation circuit comprises:

an operational amplifier having an inverting input coupled to receive the control voltage and a non-inverting input coupled to the harvested node to receive the harvested voltage, and having an output;
a transistor having a control node coupled to the output of the operational amplifier and having a first signal node coupled to the harvested node and a second signal node;
a first electronic device having a first node coupled to the second signal node of the transistor and a second node coupled to a bias node on which the cascode drive voltage is generated;
a second electronic device having a first node coupled to the bias node and a second node coupled to another node;
a first resistor coupled between the first complementary clock line and the another node; and
a second resistor coupled between the second complementary clock line and the another node.

5. The open drain transmitter of claim 1 further comprising a supplemental power feed circuit coupled to the node, the supplemental power feed circuit operable to supply a feed current to the node when the drive currents from the data and clock channels are insufficient to maintain the harvested voltage at the required value and power components in the transmitter, and operable to remove a shunt current from the node when drive currents are greater than the current needed to maintain the harvested voltage and power the components in the transmitter.

6. The open drain transmitter of claim 2, wherein each data channel further comprises:
a first predriver circuit through which the first complementary data signal is applied to the control node of the third transistor;
a second predriver circuit through which the second complementary data signal is applied to the control node of the fourth transistor; and
a data serializer circuit coupled to the first and second predriver circuits and adapted to receive parallel input data, the serializer circuit operable to convert the received parallel input data into a corresponding serial data stream with each bit in this serial data stream being represented through the first and second complementary data signals.

7. The open drain transmitter of claim 3, wherein each of the first and second complementary clock signals is gated with an enable signal to generate a corresponding gated complementary clock signal that is applied to the corresponding control node of the third and fourth transistors.

8. The open drain transmitter of claim 4, wherein the first and second electronic devices each comprise a resistor.

9. The open drain transmitter of claim 5 wherein the supplemental power feed circuit comprises:
a transmitter voltage regulator operable to generate a feed voltage and feed current;
a feed transistor having a first signal node coupled to the harvested node and a second signal node coupled to the transmitter voltage regulator and having a control node;
a shunt transistor having a first signal node coupled to the harvested node and a second signal node coupled to a reference voltage source, and having a control node; and
bias logic circuitry coupled to the harvested node to receive the harvested voltage and coupled to receive a reference voltage, the bias logic circuit operable in response to the harvested and reference voltages to control the feed transistor and thereby control the value of the feed current that is supplied from the transmitter voltage regulator through the feed transistor to the harvested node, and also operable in response to the harvested and reference voltages to control the shunt transistor to sink a shunt current the harvested node.

10. An open drain transmitter, comprising:
at least one data channel, each data channel operable to communicate data and to provide a drive current that is received over the data channel and is used in generating a harvested voltage on a harvested node, and the value of the drive current being a function of a cascode drive voltage;
a clock channel operable to communicate a clock signal and including:
a communications and power harvesting circuit operable to communicate a clock signal and to provide a drive current that is received over the clock channel and is used in generating the harvested voltage, and the value of the drive current being a function of the cascode drive voltage, and
a power harvesting control circuit coupled to the clock channel to receive a bias current over the clock channel and operable in an active mode to generate the cascode drive voltage responsive to this bias current and operable in a power down mode to generate the cascode drive voltage having a value that ensures that the maximum tolerable junction voltage is not exceeded for transistors in the clock and data channels;
a supplemental power feed circuit coupled to the node, the supplemental power feed circuit operable to supply a feed current to the node when the drive currents from the data and clock channels are insufficient to maintain the harvested voltage at the required value and power components in the transmitter, and operable to remove a shunt current from the node when drive currents are greater than the current needed to maintain the harvested voltage and power the desired components in the transmitter, wherein the supplemental power feed circuit comprises:
a shunt regulator circuit operable to sink a shunt current from the harvested node responsive to the harvested voltage on the harvested node; and
a feed regulator circuit coupled to the shunt regulator and operable to source a feed current to the harvested node in response to the shunt current.

11. The open drain transmitter of claim 10, wherein the shunt regulator circuit comprises:
an operational amplifier having an output and an inverting input adapted to receive a reference voltage, and a non-inverting input coupled to receive a divided harvested voltage from a resistive voltage divider coupled between the harvested node and a reference voltage source; and
a shunt transistor having a first signal node coupled to the reference voltage source, a second signal node coupled to the harvested node and a control node coupled to the output of the operational amplifier.

12. The open drain transmitter of claim 11 wherein the feed regulator circuit comprises digital circuitry operable to generate a digital code responsive to the shunt current and to activate responsive to the digital code selected ones of a plurality of feed transistors coupled in parallel between the harvested node and a supplemental feed voltage source to thereby provide the feed current to the harvested node.

13. The open drain transmitter of claim 11 wherein the feed regulator circuit comprises analog circuitry operable to generate a bias signal responsive to the shunt current and to activate a feed transistor coupled in parallel between the harvested node and a supplemental feed voltage source in response to the bias signal to thereby provide the feed current to the harvested node.

14. The open drain transmitter of claim 11 wherein the feed regulator circuit comprises:
- a first offset voltage circuit coupled to the non-inverting input of the operational amplifier and operable to add a first voltage offset to the voltage on the non-inverting input to generate a first offset voltage;
- a second offset voltage circuit coupled to the inverting input of the operational amplifier and operable to add a second voltage offset to the voltage on the inverting input to generate a second offset voltage;
- an error amplifier having a non-inverting input coupled to the first offset voltage circuit to receive the first offset voltage and an inverting input coupled to the second offset voltage circuit to receive the second offset voltage, and having an output; and
- a feed transistor having a first signal node coupled to a supplemental feed voltage source and a second signal node coupled to the harvested node, and having a control node coupled to the output of the error amplifier.

15. An electronic system, comprising:
- a receiver including a plurality of data channels and a clock channel; and
- a transmitter coupled to the data channels and the clock channel, wherein each data channel is operable to communicate data and to provide a drive current that is received over the data channel and is used in generating a harvested voltage on a harvested node, and the value of the drive current being a function of a cascode drive voltage, and wherein the clock channel is operable to communicate a clock signal and includes:
  - a communications and power harvesting circuit operable to communicate the clock signal and to provide a drive current that is received over the clock channel and is used in generating the harvested voltage, and the value of the drive current being a function of the cascode drive voltage, and
  - a power harvesting control circuit coupled to the clock channel to receive a bias current over the clock channel and operable in an active mode to generate the cascode drive voltage responsive to this bias current and operable in a power down mode to generate the cascode drive voltage having a value that ensures that the maximum tolerable junction voltage is not exceeded for transistors in the clock and data channels, wherein the power harvesting control circuit comprises:
    - a first transistor having first and second signal nodes and a control node, the first signal node coupled to a first complementary clock line of the clock channel and the control node receiving the cascode drive voltage;
    - a second transistor having first and second signal nodes and a control node, the first signal node coupled to a second complementary clock line of the clock channel and the control node receiving the cascode drive voltage;
    - a third transistor having a first signal node coupled to the second signal node of the first transistor and having a second signal node coupled to a bias node, and having a control node adapted to receive a first complementary clock signal;
    - a fourth transistor having a first signal node coupled to the second signal node of the second transistor and having a second signal node coupled to the bias node, and having a control node adapted to receive a second complementary clock signal;
    - an external resistive circuit coupled between the bias node and a reference voltage source;
    - wherein a bias current of the clock channel is operable to flow from the corresponding complementary clock line through the corresponding first or second transistor and through the activated one of the third and fourth transistors to the bias node and through the external resistive circuit to generate a control voltage; and
    - a cascode drive voltage generation circuit coupled to the bias node and operable to generate the cascode drive voltage responsive to the control voltage during an active mode of operation and operable during a power down mode of operation to generate the cascode drive voltage having a value that is a function of a pull-up voltage applied on the complementary clock lines and of the harvested voltage.

16. The electronic system of claim 15, wherein the receiver is contained in a television and wherein the transmitter is contained in a smart phone, digital camera, or video recorder.

17. The electronic system of claim 15, wherein the receiver includes three data channels and a clock channel to that operate according to the HDMI specification.

18. The electronic system of claim 15, wherein the transmitter includes a plurality of MOS transistors.

19. The electronic system of claim 15 wherein the transmitter further comprises a supplemental power feed circuit coupled to the node, the supplemental power feed circuit operable to supply a feed current to the node when the drive currents from the data and clock channels are insufficient to maintain the harvested voltage at the required value and power components in the transmitter, and operable to remove a shunt current from the node when drive currents are greater than the current needed to maintain the harvested voltage and power the components in the transmitter.

* * * * *